United States Patent
Umeda et al.

(10) Patent No.: US 9,543,143 B2
(45) Date of Patent: Jan. 10, 2017

(54) METHOD FOR PRODUCING AMORPHOUS OXIDE THIN FILM AND THIN FILM TRANSISTOR

(71) Applicant: FUJIFILM Corporation, Minato-ku, Tokyo (JP)

(72) Inventors: Kenichi Umeda, Kanagawa (JP); Atsushi Tanaka, Kanagawa (JP); Masayuki Suzuki, Kanagawa (JP); Tatsuya Shimoda, Ishikawa (JP)

(73) Assignee: FUJIFILM Corporation, Tokyo (JP)

(*) Notice: Subject to any disclaimer, the term of this patent is extended or adjusted under 35 U.S.C. 154(b) by 137 days.

(21) Appl. No.: 14/104,714

(22) Filed: Dec. 12, 2013

(65) Prior Publication Data

US 2014/0103341 A1  Apr. 17, 2014

Related U.S. Application Data

(63) Continuation of application No. PCT/JP2012/064815, filed on Jun. 8, 2012.

(30) Foreign Application Priority Data

Jun. 14, 2011 (JP) .................................. 2011-132303
Jan. 23, 2012 (JP) .................................. 2012-011270

(51) Int. Cl.
*H01L 29/786* (2006.01)
*H01L 21/02* (2006.01)
(Continued)

(52) U.S. Cl.
CPC ... *H01L 21/02565* (2013.01); *H01L 21/02554* (2013.01); *H01L 21/02592* (2013.01);
(Continued)

(58) Field of Classification Search
CPC ............... H01L 22/12; H01L 21/02623; H01L 21/02628; H01L 21/02658; H01L 21/02664; H01L 27/14687; H01L 27/14698

See application file for complete search history.

(56) References Cited

U.S. PATENT DOCUMENTS 6,274,871 B1    8/2001  Dukor et al.
7,824,957 B2 *  11/2010 Umeda et al. ................ 438/104
(Continued)

FOREIGN PATENT DOCUMENTS

DE    10 2009 054 997 B3   6/2011
JP         2009212497 A    9/2009
(Continued)

OTHER PUBLICATIONS

International Search Report issued in International Application No. PCT/JP2012/064815 on Sep. 4, 2012.
(Continued)

*Primary Examiner* — Tucker J Wright
*Assistant Examiner* — Stephen C Smith
(74) *Attorney, Agent, or Firm* — Sughrue Mion, PLLC

(57) ABSTRACT

A method for producing an amorphous oxide thin film includes: a pre-treatment process of selectively changing a binding state of an organic component, at a temperature lower than a pyrolysis temperature of the organic component, in a first oxide precursor film containing the organic component and In, to obtain a second oxide precursor film in which, when an infrared wave number range of from 1380 $cm^{-1}$ to 1520 $cm^{-1}$ in an infrared absorption spectrum obtained by performing a measurement by Fourier transform infrared spectroscopy is divided into an infrared wave number range of from 1380 $cm^{-1}$ to 1450 $cm^{-1}$ and an infrared wave number range of from more than 1450 $cm^{-1}$ to 1520 $cm^{-1}$, a peak positioned within the infrared wave number range of from 1380 $cm^{-1}$ to 1450 $cm^{-1}$ exhibits the (Continued)

maximum value in the infrared absorption spectrum within an infrared wave number range of from 1350 cm$^{-1}$ to 1750 cm$^{-1}$; and a post-treatment process of removing the organic component remaining in the second oxide precursor film, to transform the second oxide precursor film into an amorphous oxide thin film containing In.

14 Claims, 29 Drawing Sheets

(51) Int. Cl.
    *H01L 21/66*     (2006.01)
    *H01L 27/146*     (2006.01)

(52) U.S. Cl.
    CPC ........ *H01L 21/02628* (2013.01); *H01L 22/10* (2013.01); *H01L 29/78693* (2013.01); *H01L 27/14687* (2013.01); *H01L 27/14698* (2013.01); *H01L 2924/0002* (2013.01)

(56) References Cited

U.S. PATENT DOCUMENTS

| | | | |
|---|---|---|---|
| 8,114,705 B2 | 2/2012 | Higashi et al. | |
| 8,400,817 B2* | 3/2013 | Yamazaki | H01L 21/84 365/145 |
| 8,927,329 B2* | 1/2015 | Imoto | H01L 21/0242 257/42 |
| 2007/0003877 A1* | 1/2007 | Punsalan | C23C 8/02 430/311 |
| 2007/0080428 A1 | 4/2007 | Herman et al. | |
| 2007/0155067 A1 | 7/2007 | Park et al. | |
| 2008/0237598 A1 | 10/2008 | Nakayama | |
| 2009/0152506 A1* | 6/2009 | Umeda | C30B 1/02 252/500 |
| 2010/0159346 A1 | 6/2010 | Hinago et al. | |
| 2010/0251936 A1 | 10/2010 | Kim et al. | |
| 2010/0320458 A1* | 12/2010 | Umeda | C01G 15/006 257/43 |
| 2012/0329209 A1* | 12/2012 | Song et al. | 438/104 |
| 2013/0099232 A1* | 4/2013 | Cho et al. | 257/43 |
| 2013/0122647 A1 | 5/2013 | Steiger et al. | |
| 2013/0295507 A1* | 11/2013 | Keszler et al. | 430/270.1 |

FOREIGN PATENT DOCUMENTS

| | | |
|---|---|---|
| JP | 2009-290112 A | 12/2009 |
| JP | 2010040645 A | 2/2010 |
| JP | 2010-258058 A | 11/2010 |
| JP | 2010-283002 A | 12/2010 |

OTHER PUBLICATIONS

Written Opinion of the ISA issued in International Application No. PCT/JP2012/064815 on Sep. 4, 2012.
Communication, dated Nov. 4, 2014, issued in corresponding EP Application No. 12800779.6, 6 pages in English.
Notice of Reasons for Rejection, dated May 12, 2015, issued in corresponding JP Application No. 2012- 011270, 5 pages in English and Japanese.
First Office Action, dated Jul. 21, 2015, issued in corresponding CN Application No. 201280029028.7, 14 pages in English and Chinese.
Communication dated Jan. 13, 2016, from the European Patent Office in counterpart European Application No. 12800779.6.
Communication dated Dec. 28, 2015, from the State Intellectual Property Office of People's Republic of China in counterpart Application No. 201280029028.7.
Taiwanese Office Action, issued Sep. 19, 2016, issued in corresponding TW Application No. 101120684, 18 pages in English and Chinese.

* cited by examiner

METHOD FOR PRODUCING AMORPHOUS OXIDE THIN FILM AND THIN FILM TRANSISTOR

CROSS-REFERENCE TO RELATED APPLICATIONS

This application is a continuation application of International Application No. PCT/JP2012/064815, filed Jun. 8, 2012, the disclosure of which is incorporated herein by reference in its entirety. Further, this application claims priority from Japanese Patent Application No. 2011-132303, filed Jun. 14, 2011, and Japanese Patent Application No. 2012-011270, filed Jan. 23, 2012, the disclosures of which are incorporated herein by reference in their entirety.

TECHNICAL FIELD

The present invention relates to a method for producing an amorphous oxide thin film and a thin film transistor.

BACKGROUND ART

Amorphous oxide thin films, particularly, transparent amorphous oxide semiconductors, such as In—Ga—Zn—O based (hereinafter, referred to as "IGZO") semiconductors, are called "TAOSs (Transparent Amorphous Oxide Semiconductors)" and have been studied and developed by various research institutions and makers, and significant technological progress has been made. In particular, with panel makers in Japan, Korea, and Taiwan playing a central role, trial manufacture of large-size displays is actively being carried out, discussions about reliability and stability, and moreover, technical studies toward mass production are also progressing, and production by a vacuum film forming method has almost reached a practical level.

Meanwhile, among the trends toward realizing a larger size, with an aim to reduce production costs, research and development concerning the production of TAOS-TFTs (Thin Film Transistors) by a liquid phase process (hereinafter, referred to as a "liquid phase method") are also popular. For example, in recent years, a TAOS-TFT-driven liquid crystal display produced by a liquid phase method has been reported, and thus, expectations around the world for the production of TFTs by a liquid phase method have become increasingly higher. However, regarding the liquid phase method, there are problems in that the process temperature is still higher compared to the vacuum film forming method and in that it is difficult to obtain a thin film with good quality, which should be overcome in the future.

Japanese Patent Application Laid-Open (JP-A) No. 2010-258058 discloses a method for producing an amorphous oxide thin film, the method including subjecting a semiconductor precursor film formed on a substrate to a heating treatment together with irradiation with electromagnetic waves, to transform the semiconductor precursor film into an amorphous metal oxide semiconductor film. Further, JP-A No. 2010-258058 also discloses that it is preferable to remove organic components other than metal components by performing washing by a dry washing process such as oxygen plasma or UV ozone washing, after the formation of the semiconductor precursor film but before semiconductor conversion/transform treatment (before heating treatment) to decompose and wash organic substances which exist in the thin film or at the surface of the thin film and cause generation of impurities.

SUMMARY OF INVENTION

Technical Problem

However, according to the production method of JP-A No. 2010-258058, all the organic components other than metal components in the semiconductor precursor film are removed as a result, before the semiconductor conversion/transform treatment. The present inventors have made intensive studies and found that a binding state of organic components before semiconductor conversion/transform treatment, that is, before heating treatment, leads to improvement in membrane properties of the amorphous oxide thin film, such as improvement in on-state current of TFT properties or the like.

The present invention has been made in view of the above circumstances, and an object of the present invention is to provide a method for producing an amorphous oxide thin film, by which membrane properties are improved, and a thin film transistor.

Solution to Problem

The above problems of the present invention are addressed by the following means.

<1> A method for producing an amorphous oxide thin film, the method comprising:

a pre-treatment process of selectively changing a binding state of an organic component at a temperature lower than a pyrolysis temperature of the organic component in a first oxide precursor film containing the organic component and In, to obtain a second oxide precursor film in which when an infrared wave number range of from 1380 $cm^{-1}$ to 1520 $cm^{-1}$ in an infrared absorption spectrum obtained by performing a measurement by Fourier transform infrared spectroscopy is divided into an infrared wave number range of from 1380 $cm^{-1}$ to 1450 $cm^{-1}$ and an infrared wave number range of from more than 1450 $cm^{-1}$ to 1520 $cm^{-1}$, a peak positioned within the infrared wave number range of from 1380 $cm^{-1}$ to 1450 $cm^{-1}$ exhibits the maximum value in the infrared absorption spectrum within an infrared wave number range of from 1350 $cm^{-1}$ to 1750 $cm^{-1}$; and a post-treatment process of removing the organic component remaining in the second oxide precursor film, to transform the second oxide precursor film into an amorphous oxide thin film containing In.

<2> The method for producing an amorphous oxide thin film according to <1>, wherein the selectively changing a binding state of the organic component in the pre-treatment process comprises a change corresponding to a decrease in intensity of a peak which is derived from the organic component and is positioned within an infrared wave number range of from 1500 $cm^{-1}$ to 1600 $cm^{-1}$, in an infrared absorption spectrum obtained when the second oxide precursor film is analyzed by Fourier transform infrared spectroscopy.

<3> The method for producing an amorphous oxide thin film according to <1> or <2>, wherein the selectively changing a binding state of the organic component in the pre-treatment process comprises a change corresponding to a lowering of a peak which is derived from the organic component and is positioned within an infrared wave number range of from 2750 $cm^{-1}$ to 3050 $cm^{-1}$, in an infrared absorption spectrum obtained when the second oxide precursor film is analyzed by Fourier transform infrared spectroscopy.

<4> The method for producing an amorphous oxide thin film according to <2>, wherein, in the infrared absorption spectrum obtained when the second oxide precursor film is analyzed by Fourier transform infrared spectroscopy, a rate of lowering of the peak positioned within the infrared wave number range of from 1500 cm$^{-1}$ to 1600 cm$^{-1}$ is 0.37 or less, when the peak positioned within the infrared wave number range of from 1500 cm$^{-1}$ to 1600 cm$^{-1}$ before the pre-treatment process is designated as 1.

<5> The method for producing an amorphous oxide thin film according to <4>, wherein, in the infrared absorption spectrum obtained when the second oxide precursor film is analyzed by Fourier transform infrared spectroscopy, a rate of lowering of the peak positioned within the infrared wave number range of from 1500 cm$^{-1}$ to 1600 cm$^{-1}$ is 0.11 or less, when the peak positioned within the infrared wave number range of from 1500 cm$^{-1}$ to 1600 cm$^{-1}$ before the pre-treatment process is designated as 1.

<6> The method for producing an amorphous oxide thin film according to any one of <1> to <5>, wherein the pre-treatment process is a photo treatment process.

<7> The method for producing an amorphous oxide thin film according to <6>, wherein the photo treatment process comprises irradiating the first oxide precursor film with ultraviolet rays.

<8> The method for producing an amorphous oxide thin film according to <6> or <7>, wherein, in the pre-treatment process, the photo treatment is performed using a total amount of energy of 4 times or more, with respect to a total amount of energy of a photo treatment necessary when a peak positioned within the infrared wave number range of from 1380 cm$^{-1}$ to 1520 cm$^{-1}$, in the infrared absorption spectrum obtained when the second oxide precursor film is analyzed by Fourier transform infrared spectroscopy, begins to exhibit the maximum value in the infrared absorption spectrum within the infrared wave number range of from 1350 cm$^{-1}$ to 1750 cm$^{-1}$, along with a lapse of time of the photo treatment.

<9> The method for producing an amorphous oxide thin film according to <8>, wherein, in the pre-treatment process, the photo treatment is performed using a total amount of energy of 6 times or less, with respect to a total amount of energy of a photo treatment necessary when a peak positioned within the infrared wave number range of from 1380 cm$^{-1}$ to 1520 cm$^{-1}$, in the infrared absorption spectrum obtained when the second oxide precursor film is analyzed by Fourier transform infrared spectroscopy, begins to exhibit the maximum value in the infrared absorption spectrum within the infrared wave number range of from 1350 cm$^{-1}$ to 1750 cm$^{-1}$, along with a lapse of time of the photo treatment.

<10> The method for producing an amorphous oxide thin film according to any one of <1> to <9>, wherein the post-treatment process is a heat treatment process of performing heat treatment at a temperature equal to or higher than 425° C.

<11> The method for producing an amorphous oxide thin film according to any one of <1> to <10>, wherein the first oxide precursor film comprises an inorganic component including In and at least one selected from the group consisting of Ga, Zn, and Sn.

<12> The method for producing an amorphous oxide thin film according to <11>, wherein a composition of the inorganic component is a composition such that InGaZnO$_{4-\delta}$ (in which, δ represents an oxygen nonstoichiometric amount) appears in a single phase as a crystalline phase, resulting from a heat treatment process at a temperature equal to or higher than a crystallization temperature.

<13> The method for producing an amorphous oxide thin film according to any one of <1> to <12>, further comprising, before the pre-treatment process, a formation process of forming the first oxide precursor film by a liquid phase method using a solution containing a metal alkoxide or an organic acid salt.

<14> A thin film transistor using, as an active layer, an amorphous oxide thin film produced by the method for producing an amorphous oxide thin film according to any one of <1> to <13>.

<15> A thin film transistor using, as an insulating layer, an amorphous oxide thin film produced by the method for producing an amorphous oxide thin film according to any one of <1> to <13>.

<16> A thin film transistor using, as a conductive layer, an amorphous oxide thin film produced by the method for producing an amorphous oxide thin film according to any one of <1> to <13>.

Advantageous Effects of Invention

According to the present invention, a method for producing an amorphous oxide thin film, by which membrane properties are improved, and a thin film transistor can be provided.

DESCRIPTION OF EMBODIMENTS

Figure 1:
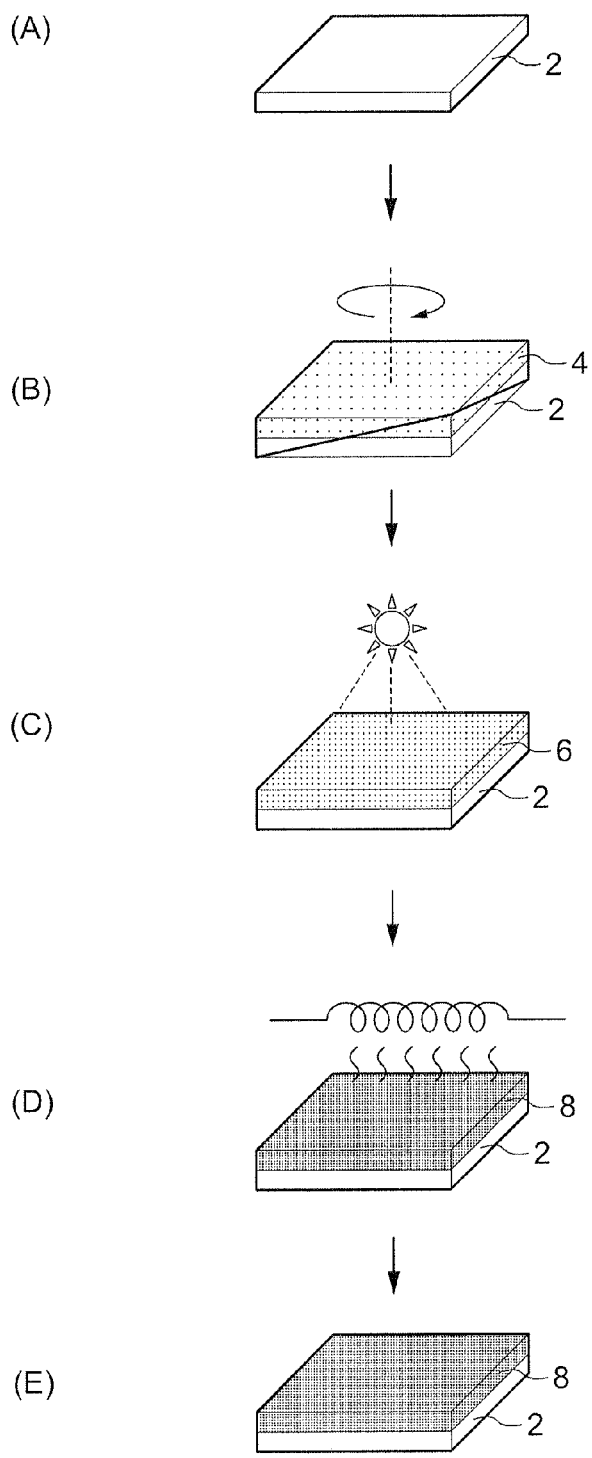
FIG. 1 is a process chart showing a method for producing an amorphous oxide thin film according to an exemplary embodiment of the present invention.

Hereinafter, a method for producing an amorphous oxide thin film and a thin film transistor according to exemplary embodiments of the present invention are specifically explained with reference to the accompanying drawings. Note that, in the drawings, the same symbol is put to the same member or to a member (constituent part) having an similar function, and explanation is appropriately omitted.

1. Method for Producing Amorphous Oxide Thin Film

The method for producing an amorphous oxide thin film according to an exemplary embodiment of the present invention includes: a pre-treatment process of selectively changing a binding state of an organic component at a temperature lower than a pyrolysis temperature of the organic component in a first oxide precursor film containing the organic component and In, to obtain a second oxide precursor film in which when an infrared wave number range of from 1380 $cm^{-1}$ to 1520 $cm^{-1}$ in an infrared absorption spectrum obtained by performing a measurement by Fourier transform infrared spectroscopy is divided into an infrared wave number range of from 1380 $cm^{-1}$ to 1450 $cm^{-1}$ and an infrared wave number range of from more than 1450 $cm^{-1}$ to 1520 $cm^{-1}$, a peak positioned within the infrared wave number range of from 1380 $cm^{-1}$ to 1450 $cm^{-1}$ exhibits the maximum value in the infrared absorption spectrum within an infrared wave number range of from 1350 $cm^{-1}$ to 1750 $cm^{-1}$; and a post-treatment process of removing the organic component remaining in the second oxide precursor film, to transform the second oxide precursor film into an amorphous oxide thin film containing In.

Note that, the "pyrolysis temperature" is a temperature at which weight loss accompanying an endothermic reaction is terminated, when measurement of TG-DTA is carried out with respect to the first oxide precursor film, and is, for example, 425° C. Further, the scope of the expression "removing the organic component" used herein includes not only removing the whole organic component, but may also include removing a part of the organic component.

By using such a production method, improvement in membrane properties of the obtained amorphous oxide thin film can be realized.

Hereinafter, a production method of an amorphous oxide thin film according to an exemplary embodiment of the present invention is specifically described. FIG. 1 is a process chart showing a method for producing an amorphous oxide thin film according to an exemplary embodiment of the present invention.

<Substrate Providing Process>

First, as shown in FIG. 1 (A), a substrate 2 for film-forming an amorphous oxide thin film is provided. The shape, structure, size, and the like of the substrate 2 are not particularly limited, and can be selected as appropriate, depending on the intended use. The structure of the substrate 2 may be a monolayer structure or may be a laminate structure.

The material of the substrate 2 is not particularly limited and, for example, an inorganic substrate formed from glass, YSZ (yttrium stabilized zirconium), or the like, a substrate made from resin (resin substrate) or a composite material thereof, or the like may be used. Among them, a substrate made from resin or a composite material thereof is preferable from the viewpoints of being lightweight and having flexibility. Specific examples thereof, which can be used, include synthetic resin substrates of polybutylene terephthalate, polyethylene terephthalate, polyethylene naphthalate, polybutylene naphthalate, polystyrene, polycarbonate, polysulfone, polyether sulfone, polyarylate, allyl diglycol carbonate, polyamide, polyimide, polyamideimide, polyether imide, polybenzazole, polyphenylene sulfide, polycycloolefin, a norbornene resin, a fluororesin such as poly (chlorotrifluoroethylene), a liquid crystal polymer, an acrylic resin, an epoxy resin, a silicone resin, an ionomer resin, a cyanate resin, crosslinked fumaric acid diester, cyclic polyolefin, aromatic ether, maleimide-olefin, cellulose, an episulfide compound, or the like; a composite plastic material including silicon oxide particles; a composite plastic material including metal nanoparticles, inorganic oxide nanoparticles, inorganic nitride nanoparticles, or the like; a composite plastic material including carbon fiber or carbon nanotube; a composite plastic material including glass flake, glass fiber, or glass beads; a composite plastic material including clay minerals or particles having a mica-derived crystalline structure; a laminated plastic material having at least one junction interface between thin glass and the above single organic material; a composite material which has at least one junction interface by alternately laminating an inorganic layer and an organic layer, and exhibits barrier performance; a stainless steel substrate or a metal multilayer substrate in which stainless steel and a different metal are laminated; an aluminum substrate or an oxide film-attached aluminum substrate which is prepared by subjecting the surface to an oxidation treatment (for example, an anodic oxidation treatment) in order to improve the insulation property of the surface; and the like. Further, the resin substrate preferably has excellent heat resistance, excellent dimensional stability, excellent solvent resistance, excellent electric insulation property, excellent workability, low gas permeability, low hygroscopic property, or the like. The resin substrate may be provided with a gas barrier layer for preventing permeation of moisture or oxygen, an undercoat layer for improving flatness of the resin substrate or adhesion to a lower electrode, or another layer.

There is no particular limitation as to the thickness of the substrate 2 in the present invention, and the thickness of the substrate 2 is preferably from 50 μm to 1000 μm, and more preferably from 50 μm to 500 μm. When the thickness of the substrate 2 is 50 μm or more, flatness of the substrate 2 itself is more improved. Further, when the thickness of the substrate 2 is 500 μm or less, flexibility of the substrate 2 itself is more improved, and the use of the substrate as a substrate for a flexible device is more facilitated.

<Formation Process>

Next, as shown in FIG. 1 (B), using a liquid phase method, for example, spin coating, ink jetting, dispenser, screen printing, letterpress printing, intaglio printing, or the like, a first oxide precursor film 4 containing an organic component and In, that is a precursor film of the amorphous oxide thin film according to the exemplary embodiment of the invention, is formed on the substrate 2.

It is preferable that the first oxide precursor film 4 contains an inorganic component including In, and at least one selected from the group consisting of Ga, Zn, and Sn, and it is more preferable that the first oxide precursor film 4 contains an inorganic component including In, Ga, and Zn. In a case in which the inorganic component in the first oxide precursor film 4 includes In, Ga, and Zn, when heat treatment is performed at a temperature equal to or higher than a crystallization temperature in the post-treatment process described below, the composition of the inorganic component is preferably a composition such that $InGaZnO_{4-\delta}$ (in which, $\delta$ represents an oxygen nonstoichiometric amount) appears in a single phase as a crystalline phase. The composition is, for example, In:Ga:Zn=2-x:x: 1 (in which x represents a number of from 0.8 to 1.05). The amorphous oxide thin film, which is obtained by using a composition as described above and using a conventional production method, exhibits low TFT properties such as low mobility and is in a state that it is difficult to put into practical use, in the case of using the amorphous oxide thin film as an active layer of a thin film transistor. However, by going through the production method according to the exemplary embodiment of the invention, even using a composition as described above, the TFT properties that are capable of being put to practical use can be enhanced. When a composition that falls outside the range of the above composition is used, the TFT properties are good even if a conventional production method is used, but by going through the production method according to the exemplary embodiment of the invention, it is possible to further enhance the TFT properties.

As to the solution used for the liquid phase method, various solutions can be used, and it is preferable to use a solution containing a metal alkoxide or an organic acid salt. Particularly, it is preferable to use a solution containing a metal alkoxide, from the viewpoint that a process for removing unnecessary impurity components (nitric acid, chlorine, or the like) is not needed unlike the case of using a nitric acid salt or a chloride, and from the viewpoint of preventing the generation of poisonous gas. A thin film such as an electrode or an insulating film as described below may be provided between the substrate 2 and the precursor film 4.

Examples of a complex group of the organic acid salt include a β-diketone complex group, a β-ketocarboxylic acid ester complex group, a β-keto carboxylic acid complex group, and a ketoxy group (a ketoxy complex group). Examples of the β-diketone complex group may include 2,4-pentanedione (also called acetylacetone or acetoacetone), 1,1,1,5,5,5-hexamethyl-2,4-pentanedione, 2,2,6,6-tetramethyl-3,5-heptanedione, and 1,1,1-trifluoro-2,4-penetanedione. Examples of the β-ketocarboxylic acid ester complex may include acetoacetic acid methyl ester, acetoacetic acid ethyl ester, acetoacetic acid propyl ester, ethyl trimethylacetoacetate, and methyl trifluoroacetoacetate. Examples of the β-keto carboxylic acid may include acetoacetic acid and trimethylacetoacetic acid. Examples of the aceto-oxy group may include an aceto-oxy group (or an acetoxy group), a propionyloxy group, a butylyloxy group, an acryloyloxy group, and a methacryloyloxy group. These groups each preferably have 18 or less carbon atoms. Further, these groups may be straight chain groups or branched, or a hydrogen atom in these groups may be replaced with a fluorine atom.

The metal alkoxide solution is a solution containing at least a metal alkoxide compound represented by the following Formula I.

$$M(OR)_n \quad \text{Formula [I]}$$

Here, M in Formula [I] represents a metal atom, and n represents an integer of 1 or more.

Particularly, the metal alkoxide solution is preferably a solution which contains metal alkoxide compounds represented by the following Formula II and Formula III, and has a viscosity of from 1 mPa·s to 100 mPa·s.

$$Zn(OR^1)_2 \quad [II]$$

$$M(OR^2)_3 \quad [III]$$

When such a metal alkoxide solution is used, metal oxide nanoparticles having satisfactory semiconductor properties even in an amorphous state can be obtained by heating the solution itself, and therefore, a semiconductor thin film can be formed simply and easily.

In the exemplary embodiment of the invention, at least a metal alkoxide compound in which M represents In in Formula II above exists in the solution. Further, from the viewpoint of electrical properties, it is preferable that a metal alkoxide compound in which M represents Ga and a metal alkoxide compound in which M represents In exist in the solution. Moreover, from the viewpoint of the cost of materials, it is preferable that a metal alkoxide compound in which M represents Al and a metal alkoxide compound in which M represents In exist in the solution.

The metal alkoxide compounds represented by Formula I to III each may exist alone in the metal alkoxide solution, or portions thereof may link together to form a composite alkoxide. When metal alkoxide compounds represented by Formula II and Formula III are used, in the compounds and/or composite alkoxide in the metal alkoxide solution, the ratio Zn/M is preferably in a range of from 0.2 to 10. When the ratio Zn/M is less than 0.2, the costs of raw materials are high; whereas, when the ratio Zn/M exceeds 10, the amount of Zn component becomes excessive, and thus, crystals of zinc oxide are generated, and it is difficult to form composite oxide nanoparticles. The range of Zn/M is preferably a range of from 0.2 to 1.5, and more preferably a range of from 0.5 to 1.3, from the viewpoint of electrical properties.

In Formulae I to III above, R, $R^1$, and $R^2$ may be the same as or different from each other, each represent an alkyl group having from 1 to 20 carbon atoms, preferably from 1 to 6 carbon atoms, and may be substituted or unsubstituted. When the alkyl group has more than 20 carbon atoms, the distance between metal molecules becomes large, and there are cases in which the alkyl group remains in the metal oxide at the time of thin film formation, which is thus not preferable. Examples of a substituent may include an alkyl group having from 1 to 4 carbon atoms, an amino group (the hydrogen atom of the amino group may be substituted with an alkyl group having from 1 to 4 carbon atoms), an alkoxy group having from 1 to 4 carbon atoms, and a hydroxyl group.

Examples of a compound represented by such compounds represented by Formulae I to III may include zinc ethoxide, zinc ethoxyethoxide, zinc dimethylaminoethoxide, zinc methoxyethoxide, indium isopropoxide, indium n-butoxide, indium methoxyethoxide, indium diethylaminoethoxide, gallium ethoxide, gallium isopropoxide, aluminum isopropoxide, aluminum n-butoxide, aluminum s-butoxide, aluminum t-butoxide, aluminum ethoxide, aluminum ethoxyethoxyethoxide, and iron propoxide.

Further, in the metal alkoxide solution, the metal alkoxide compounds of Formula II and Formula III are contained such that the total concentration of Zn and M is preferably from 0.5% by mass to 20% by mass, and more preferably from 1% by mass to 10% by mass. When the total concentration is less than 0.5% by mass, there are cases in which a uniform thin film cannot be formed, and when the total concentration exceeds 20% by mass, there are cases in which a thin film having a sufficiently small thickness cannot be formed.

Further, concerning the viscosity of the nanoparticle dispersion liquid, although it varies depending on the coating means, for example, in the case of ink jetting or dispenser, from the viewpoint of ejectability, the viscosity is preferably from 1 mPa·s to 100 mPa·s, and more preferably from 1 mPa·s to 20 mPa·s. The viscosity of the nanoparticle dispersion liquid can be measured by using a commercially available viscometer, for example, a shaking type viscometer VISCOMATE (manufactured by CBC Materials Co., Ltd.).

The metal alkoxide solution contains an appropriate solvent for dissolving the above metal alkoxide compound. Examples of the solvent may include water, alcohols, amino alcohols, and glycols; and, from the viewpoints of stability and drying property of the dispersion, it is more preferable that the metal alkoxide solution contains at least one high boiling point solvent represented by the following Formula IV.

$$R^3\text{---}OH \quad [IV]$$

Here, $R^3$ represents a substituted or unsubstituted alkyl group having from 2 to 12 carbon atoms, an alkenyl group, a cycloalkyl group, or an aryl group.

Examples of the alkyl group include a methyl group, an ethyl group, a propyl group, an isopropyl group, a butyl group, a pentyl group, a hexyl group, and an octyl group. Examples of the alkenyl group include a butenyl group and a propenyl group; examples of the cycloalkyl group include a cyclohexyl group; and examples of the aryl group include a phenyl group.

Preferable examples of a substituent for the alkyl group or the alkenyl group include an alkoxy group (a methoxy group, an ethoxy group, an isopropoxy group, a methoxyethoxy group, a phenoxy group, or the like), a hydroxyl group, and an amino group. Preferable examples of a substituent for the cycloalkyl group or the aryl group include an alkyl group (a methyl group, an ethyl group, a hydroxyethyl group, or the like), an alkoxy group (a methoxy group, an ethoxy group, an isopropoxy group, a methoxyethoxy group, a phenoxy group, or the like), a hydroxyl group, and an amino group.

Particularly preferable examples of the substituent include a dialkylamino group (a dimethylamino group, a diethylamino group, a di-n-propylamino group, a diisopropylamino group, a di-n-butylamino group, a di-t-butylamino group, or the like).

The boiling point of the high boiling point solvent represented by Formula IV is from 120° C. to 250° C. and, from the viewpoint of reducing the burden at the time of drying, the boiling point is preferably from 130° C. to 200° C. When the boiling point is lower than 120° C., the drying speed is fast so that sufficient smoothness is less likely to be obtained, which is thus not preferable; and when the boiling point exceeds 250° C., the solvent is prone to remain during the formation of a thin film, which is thus not preferable.

Examples of the solvent represented by Formula IV may include 2-ethoxyethanol, 2-(methoxyethoxy)ethanol, 2-(ethoxyethoxy)ethanol, 2-isopropoxyethanol, 1-ethoxy-2-propanol, 2-diethylaminoethanol, 2-dipropylaminoethanol, cyclohexanol, ethylene glycol, diethylene glycol, and benzyl alcohol.

Examples of a solvent, which can be used in combination with the above disperse medium include dioxane, dimethylformamide, dimethylsulfoxide, and acetylacetone.

Further, the metal alkoxide solution may be used as a solution for coating, after adding various additives such as an antistatic agent, a plasticizer, a polymer binder, a thickener, or the like, depending on the purpose to adjust physical properties.

<Pre-Treatment Process>

Next, as shown in FIG. 1 (C), a pre-treatment process is performed, which includes, selectively changing a binding state of an organic component at a temperature lower than a pyrolysis temperature of the organic component in a first oxide precursor film 4 which is prepared by the formation process described above and contains the organic component and In, to obtain a second oxide precursor film 6 in which when an infrared wave number range of from 1380 $cm^{-1}$ to 1520 $cm^{-1}$ in an infrared absorption spectrum obtained by performing a measurement by Fourier transform infrared spectroscopy is divided into an infrared wave number range of from 1380 $cm^{-1}$ to 1450 $cm^{-1}$ and an infrared wave number range of from more than 1450 $cm^{-1}$ to 1520 $cm^{-1}$, a peak positioned within the infrared wave number range of from 1380 $cm^{-1}$ to 1450 $cm^{-1}$ exhibits the maximum value in the infrared absorption spectrum within an infrared wave number range of from 1350 $cm^{-1}$ to 1750 $cm^{-1}$.

Note that, the reason why a temperature lower than the pyrolysis temperature of the organic component is used is because, when the organic component is thermally decomposed, an organic substance does not remain after the pre-treatment process, and thus, even though the post-treatment process described below is performed as it is, it is difficult to achieve improvement in membrane properties. The peak positioned within the infrared wave number range of from 1380 $cm^{-1}$ to 1520 $cm^{-1}$ is a peak derived from an In precursor raw material.

When such a pre-treatment process is performed, the amorphous oxide thin film obtained after the post-treatment process described below exhibits high mobility, which results in improvement in membrane properties. Further, in a case in which this amorphous oxide thin film is used as an active layer of a TFT, a high on-off ratio is high, which results in improvement in membrane properties. Specifically, from the moment at which the peak positioned within the infrared wave number range of from 1380 $cm^{-1}$ to 1450 $cm^{-1}$ begins to exhibit the maximum value in the infrared absorption spectrum within an infrared wave number range of from 1350 $cm^{-1}$ to 1750 $cm^{-1}$, the number of digits of the value of mobility increases by about one or more, and the on-off ratio rapidly becomes higher.

The means of the pre-treatment process is not limited as long as it functions as described above and, may be, for example, at least one selected from the group consisting of a photo treatment process and a plasma treatment process, but particularly, from the viewpoint that the treatment costs are reduced, a photo treatment process is preferred. Further, in the photo treatment process, it is preferable to irradiate the first oxide precursor film 4 with ultraviolet rays. The reason why the irradiation with ultraviolet rays is preferable is because the binding state of organic components tends to be changed by irradiation with light having a short wavelength such as ultraviolet rays. For example, in the case of using a low pressure mercury lamp, ultraviolet rays of 185 nm (645 KJ/mol) and 254 nm (472 KJ/mol) exist as the main component, and thus, it is possible to decompose bonds of various organic components such as C—H (413.4 KJ/mol), C═C (607 KJ/mol), C—O (351.5 KJ/mol), or the like. Therefore, the wavelength of the ultraviolet rays is preferably from 100 nm to 450 nm, and more preferably from 150 nm to 300 nm. Examples of the light source, which can be used, include a low pressure mercury lamp, a deuterium lamp, a xenon excimer lamp, a metal halide lamp, and an excimer laser.

Moreover, it is possible to change the binding state of the organic component by the photo treatment alone, but since the thin film aimed to be obtained finally is an oxide, by using active oxygen, oxygen plasma, or the like, represented by ozone or oxygen radicals with the photo treatment process in combination, further improvement in membrane properties can be realized. In the case of using ozone, ozone is generated by irradiation with ultraviolet rays in the presence of oxygen, but ozone may be positively introduced by using an ozonizer or the like.

Note that, regarding the measurement apparatus used in Fourier transform infrared spectroscopy in the exemplary embodiment of the invention, the apparatus name is BRUKER ALPHA, and the measurement configuration is a diamond ATR configuration.

In the pre-treatment process, it is preferable that a photo treatment is performed using a total amount of energy of 4 times or more, with respect to the total amount of energy of a photo treatment necessary when a peak positioned within an infrared wave number range of from 1380 $cm^{-1}$ to 1520 $cm^{-1}$, in the infrared absorption spectrum obtained when the second oxide precursor film 6 is analyzed by Fourier transform infrared spectroscopy, begins to exhibit the maximum value in the infrared absorption spectrum within the infrared wave number range of from 1350 $cm^{-1}$ to 1750 $cm^{-1}$, along with a lapse of time of the photo treatment.

As described above, in the case of using the amorphous oxide thin film, which is obtained after the post-treatment process described below, as an active layer of a TFT, by performing a photo treatment using a total amount of energy of 4 times or more, a higher on-off ratio is realized and stabilization (saturation) is realized, as compared to the case of using a total amount of energy of less than 4 times. In addition, a higher mobility is realized and stabilization (saturation) is realized, as compared with the case of using a total amount of energy of less than 4 times.

Further, in the pre-treatment process, it is more preferable that a photo treatment is performed using a total amount of energy of from 4 times to 6 times, with respect to the total amount of energy of a photo treatment necessary when a peak positioned within the infrared wave number range of from 1380 $cm^{-1}$ to 1520 $cm^{-1}$, in the infrared absorption spectrum obtained when the second oxide precursor film 6 is analyzed by Fourier transform infrared spectroscopy, begins to exhibit the maximum value in the infrared absorption spectrum within an infrared wave number range of from 1350 $cm^{-1}$ to 1750 $cm^{-1}$, along with a lapse of time of the photo treatment.

When a total amount of energy of more than 6 times is used, although the mobility is stabilized (saturated), a long-term photo treatment is performed with respect to the second oxide precursor film 6. By performing photo treatment using a total amount of energy of from 4 times to 6 times, a long-term photo treatment can be avoided, and deterioration of electric conductivity due to oxidation of the metal in the solution can be suppressed. Further, in a case in which the substrate 2 is a resin substrate or a substrate formed from a composite material of a resin as described above, deformation of the substrate 2 due to the photo treatment can be suppressed.

It is preferable that the selectively changing a binding state of the organic component in the pre-treatment process includes a change corresponding to a lowering of a peak which is derived from the organic component and is positioned within an infrared wave number range of from 1500 $cm^{-1}$ to 1600 $cm^{-1}$, as compared to the infrared absorption spectrum of the first oxide precursor film 4, in an infrared absorption spectrum obtained when the second oxide precursor film 6 is analyzed by Fourier transform infrared spectroscopy. A part of the peak positioned within this range is assumed to be a CO based peak. Here, even if a photo treatment as the pre-treatment process is only performed, due to the solution used in the formation process or the organic component in the first oxide precursor film 4, it is possible to change the kind of peak that is to be lowered. As such, when the kind of peak that is to be selectively lowered by the pre-treatment process is specified to a peak positioned within an infrared wave number range of from 1500 $cm^{-1}$ to 1600 $cm^{-1}$, improvement in membrane properties can reliably be realized.

It is preferable that the selectively changing a binding state of the organic component in the pre-treatment process includes a change corresponding to a lowering of a peak which is derived from the organic component and is positioned within an irradiated infrared wave number range of from 2750 $cm^{-1}$ to 3050 $cm^{-1}$, separately or together with the lowering of the peak positioned within an infrared wave number range of from 1500 $cm^{-1}$ to 1600 $cm^{-1}$, as compared to the infrared absorption spectrum of the first oxide precursor film 4, in an infrared absorption spectrum obtained when the second oxide precursor film 6 is analyzed by Fourier transform infrared spectroscopy. The peak positioned within this range is assumed to be a CH based peak. As such, when the kind of peak that is to be selectively lowered by of the pre-treatment process, is specified to a peak positioned within an irradiated infrared wave number range of from 2750 $cm^{-1}$ to 3050 $cm^{-1}$, improvement in membrane properties can reliably be realized.

Further, after the pre-treatment process but before the post-treatment process, in the infrared absorption spectrum obtained when the second oxide precursor film 6 is analyzed by Fourier transform infrared spectroscopy, a rate of lowering of the peak positioned within the infrared wave number range of from 1500 $cm^{-1}$ to 1600 $cm^{-1}$ is preferably 0.37 or less, and more preferably 0.11 or less, when the peak positioned within the infrared wave number range of from 1500 $cm^{-1}$ to 1600 $cm^{-1}$ before the pre-treatment process is designated as 1. This is because, when the rate of lowering of peak is 0.37 or less, in the infrared absorption spectrum obtained when the second oxide precursor film 6 is analyzed by Fourier transform infrared spectroscopy, the peak positioned within the infrared wave number range of from 1380 $cm^{-1}$ to 1450 $cm^{-1}$ tends to exhibit the maximum value in the infrared absorption spectrum within an infrared wave number range of from 1350 $cm^{-1}$ to 1750 $cm^{-1}$. Note that, the rate of lowering of peak can be adjusted by, for example, the wavelength of irradiation light, the irradiation time, the irradiation amount, or the like.

<Post-Treatment Process>

Next, as shown in FIG. 1 (D), a post-treatment process of removing the organic component remaining in the second oxide precursor film 6 after the pre-treatment process, to transform the second oxide precursor film 6 into an amorphous metal oxide thin film 8 containing In is performed.

The means of the post-treatment is not limited as long as it functions as described above and specific examples thereof include a heat treatment process.

Examples of a method for the heat treatment process include a method of heating using an electric furnace or a muffle furnace, an infrared lamp or hot plate type heating method, and the like.

In the heat treatment process, it is preferable that the second oxide precursor film 6 is heat-treated at a temperature equal to or higher than 425° C. This is because, as compared to the case of performing heat treatment at a temperature lower than 425° C., the number of digits of the value of mobility of the amorphous oxide thin film 8 obtained through performing the heat treatment can increase by about three.

Further, in a case in which the second oxide precursor film 6 includes all of In, Ga, and Zn, during the process of transforming the second oxide precursor film 6 into an amorphous oxide thin film 8, it is preferable to perform heat treatment at a temperature lower than 800° C., particularly preferably, at a temperature equal to or lower than 700° C., from the viewpoint of keeping the amorphous state. Particularly, from the viewpoint of suppressing dissolution or deformation of the substrate 2, it is preferable to perform heat treatment at a temperature equal to or lower than 600° C.

Regarding the atmosphere of the heat treatment, it is preferable to perform heat treatment in an oxidizing atmosphere, from the viewpoint of ease of obtaining oxides. As the oxidizing atmosphere, anyway, the air (partial pressure of oxygen 21%, (the content of moisture contained in the whole atmosphere is 16° C. in terms of drew point temperature (absolute humidity 13.6 $g/m^{-3}$))) may be used. Further, it is preferable to use an atmosphere in which the partial pressure of oxygen accounts for 20% or more of the total pressure and, for example, an atmosphere having a partial pressure of oxygen of 100%, (flow from a gas bomb; the content of moisture contained in the whole atmosphere is −36° C. or lower in terms of drew point temperature (absolute humidity 0.21 $g/m^{-3}$ or less)) may also be used.

<Additional Process>

At last, as shown in FIG. 1 (E), an additional process which includes performing etching of the amorphous oxide thin film 8 obtained in the post-treatment process, forming a thin film on the amorphous oxide thin film 8, and the like is performed, appropriately.

By going through the above processes, an amorphous oxide thin film 8 having improved membrane properties can be obtained. Such an amorphous oxide thin film 8 is useful as an active layer, a conductive layer, or an insulating layer of a thin film transistor, and particularly, as an active layer.

2. Thin Film Transistor

The thin film transistor (hereinafter, referred to as "TFT") according to the exemplary embodiment of the invention has a gate electrode, a gate insulating film, an active layer, a source electrode, and a drain electrode, and is an active device having functions of applying a voltage to the gate electrode, controlling the current flowing to the active layer, and switching the current between the source electrode and the drain electrode. In the thin film transistor according to the exemplary embodiment of the invention, the amorphous oxide thin film 8 described above is used as at least one of an active layer, an insulating layer (a gate insulating film, a protective layer, or the like), and a conductive layer (a gate electrode, a source electrode, a drain electrode, or the like).

The device structure of the TFT may be either of a so-called reverse stagger structure (also called "a bottom gate type") or a stagger structure (also called "a top gate type") based on the position of the gate electrode. Further, the device structure of the TFT may be either of a so-called top contact type or a bottom contact type, based on the contact portion of the active layer with the source electrode and drain electrode (appropriately, referred to as "source and drain electrodes").

Note that, the top gate type is a form in which a gate electrode is disposed on an upper side of the gate insulating film and an active layer is formed on a lower side of the gate insulating film; and the bottom gate type is a form in which a gate electrode is disposed on a lower side of the gate insulating film and an active layer is formed on an upper side of the gate insulating film. The bottom contact type is a form in which source and drain electrodes are formed before the formation of an active layer, so that the lower face of the active layer is in contact with the source and drain electrodes; and the top contact type is a form in which an active layer is formed before the formation of source and drain electrodes, so that the upper face of the active layer is in contact with the source and drain electrodes.

Figure 2A:
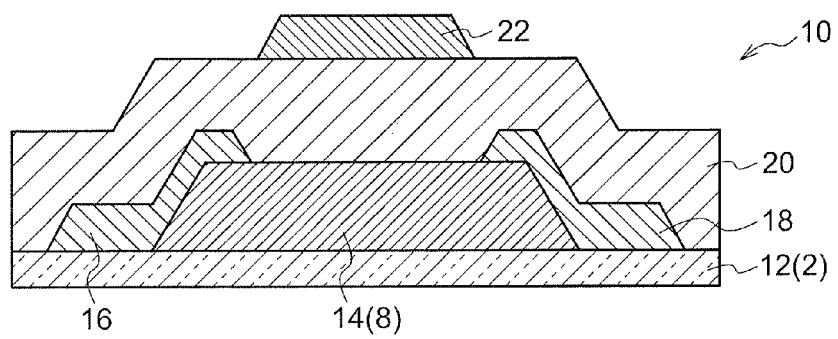
FIG. 2A is a schematic diagram showing an example of a top contact type TFT with a top gate structure, which is a TFT according to an exemplary embodiment of the present invention.

FIG. 2A is a schematic diagram showing an example of a top contact type TFT with a top gate structure, which is a TFT according to an exemplary embodiment of the invention. In the TFT 10 shown in FIG. 2A, an active layer 14 is superposed on one of the principle faces of a substrate 12. Further, on this active layer 14, a source electrode 16 and a drain electrode 18 are provided so as to be apart from each other, and further, a gate insulating film 20 and a gate electrode 22 are superposed on this assembly in this order.

Figure 2B:
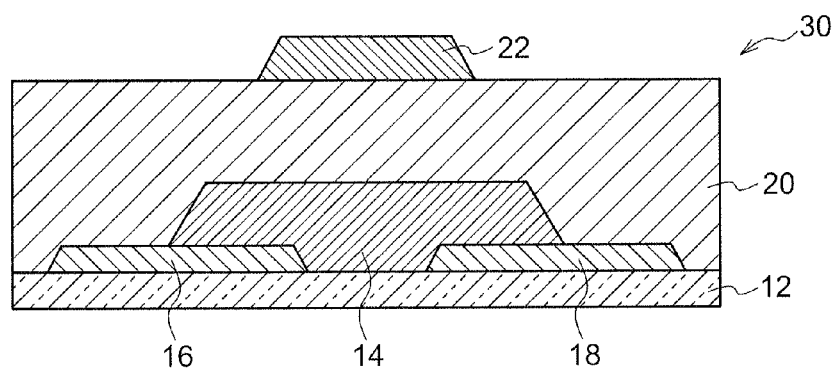
FIG. 2B is a schematic diagram showing an example of a bottom contact type TFT with a top gate structure, which is a TFT according to an exemplary embodiment of the present invention.

FIG. 2B is a schematic diagram showing an example of a bottom contact type TFT with a top gate structure, which is a TFT according to an exemplary embodiment of the invention. In the TFT 30 shown in FIG. 2B, a source electrode 16 and a drain electrode 18 are provided so as to be apart from each other on one of the principle faces of a substrate 12. An active layer 14, a gate insulating film 20, and a gate electrode 22 are superposed in this Order.

Figure 2C:
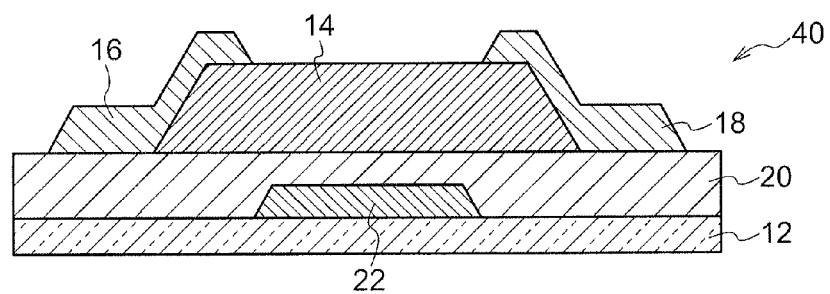
FIG. 2C is a schematic diagram showing an example of a top contact type TFT with a bottom gate structure, which is a TFT according to an exemplary embodiment of the present invention.

FIG. 2C is a schematic diagram showing an example of a top contact type TFT with a bottom gate structure, which is a TFT according to an exemplary embodiment of the invention. In the TFT 40 shown in FIG. 2C, a gate electrode 22, a gate insulating film 20, and an active layer 14 are superposed in this order onto one of the principle faces of a substrate 12. On the surface of this active layer 14, a source electrode 16 and a drain electrode 18 are provided so as to be apart from each other.

Figure 2D:
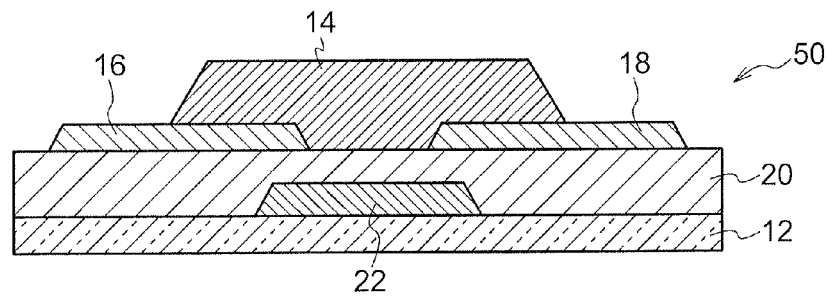
FIG. 2D is a schematic diagram showing an example of a bottom contact type TFT with a bottom gate structure, which is a TFT according to an exemplary embodiment of the present invention.

FIG. 2D is a schematic diagram showing an example of a bottom contact type TFT with a bottom gate structure, which is a TFT according to an exemplary embodiment of the invention. In the TFT 50 shown in FIG. 2D, a gate electrode 22 and a gate insulating film 20 are superposed in this order onto one of the principle faces of a substrate 12. On the surface of this gate insulating film 20, a source electrode 16 and a drain electrode 18 are provided so as to be apart from each other, and further, an active layer 14 is superposed on this assembly.

The TFT according to the exemplary embodiment of the invention can have various configuration besides those described above, and as appropriate, may have a configuration provided with a protective layer on the active layer, or an insulating layer on the substrate.

Hereinafter, the respective constituent elements are described in detail. Note that, as a representative example, the case of a top contact type TFT 10, which has a bottom gate structure shown in FIG. 2A and uses, as the active layer 14, the amorphous oxide thin film 8 according to the exemplary embodiment of the invention, is specifically explained; however, the present invention can also be applied to the case of producing a TFT having other form.

<Detailed Configuration of TFT>

—Substrate—

First, a substrate 12 for forming the TFT 10 is provided. As the substrate 12, the same substrate as the substrate 2 described above can be used.

—Active Layer—

Next, on the substrate 12, an active layer 14 is formed as a part of a transistor.

For the active layer 14, the amorphous oxide thin film 8 is used. Accordingly, the active layer 14 is formed by using a method for producing an amorphous oxide thin film 8 according to the exemplary embodiment of the invention as described above. However, it is preferable that the post-treatment process is performed just after the formation of the active layer 14 from the viewpoint of reliably removing organic substances; however, the post-treatment process may be performed after the formation of source electrode 16 and drain electrode 18, after the formation of gate electrode 22, or after the completion of TFT 10.

As a material of the amorphous oxide thin film 8, which is used as the active layer 14, an In—O based oxide semiconductor including In is used. For this oxide semiconductor, an oxide including In and at least one selected from the group consisting of Ga, Zn, and Mg is preferable, and an oxide including In and at least one selected from the group consisting of Ga and Zn is more preferable.

Particularly, an oxide including all of In, Ga, and Zn is further preferable. As an In—Ga—Zn—O based oxide semiconductor, an oxide semiconductor in which the composition in the crystalline state is represented by $InGaO_3(ZnO)_m$ (in which, m represents a natural number of less than 6) is preferable, and particularly, $InGaZnO_4$ (hereinafter, may also referred to as "IGZO") is more preferable. As the characteristics of an oxide semiconductor having the above composition, as the electric conductivity increases, the electron mobility shows a tendency to increase.

However, it is not necessary that the composition ratio of IGZO is strictly In:Ga:Zn=1:1:1. The active layer 14 may contain the oxide semiconductor as described above as the main component, and may also contain impurities or the like. The term "main component" used herein represents a component that is contained in the largest amount, among the constituent components that form the active layer 14.

After the formation of the active layer 14, the thin film is appropriately patterned depending on the device. Patterning may be performed by photolithography and etching. Specifically, a resist pattern is formed at portions that should remain by photolithography, and then etching is performed using an acid solution such as hydrochloric acid, nitric acid, dilute sulfuric acid, or a mixed liquid of one or more of phosphoric acid, nitric acid, or acetic acid, to form a pattern. Further, on the active layer 14, a protective film may be provided for protecting the active layer 14 at the time of etching the source and drain electrodes. The protective film may be formed successively after the formation of the active layer 14, or may be formed after patterning the active layer 14. Alternatively, patterning of the active layer may be carried out after the formation of the source and drain electrodes described below, whereby, damage of the active layer 14 due to patterning can be suppressed.

The layer structure of the active layer 14 may be configured to have two or more layers, and it is preferable that the active layer 14 is formed from a low resistance layer and a high resistance layer, in which the low resistance layer is in contact with the gate insulating layer 20, and the high resistance layer is electrically connected to at least one of the source electrode 16 and the drain electrode 18.

The thickness of the active layer 14 is not particularly limited, and is from 1 nm to 100 nm, and more preferably from 2.5 nm to 50 nm.

—Source and Drain Electrodes—

On the active layer 14, a conductive film for forming a source electrode 16 and a drain electrode 18 is formed.

For the conductive film, a material having high electric conductivity is used, and the conductive film can be formed by using, for example, a metal such as Al, Mo, Cr, Ta, Ti, or Au, Al—Nd, an Ag alloy, or a metal oxide conductive film of tin oxide, zinc oxide, indium oxide, indium tin oxide (ITO), or indium zinc oxide (IZO), or the like. As the source electrode 16 and the drain electrode 18, a monolayer structure of or a laminate structure of two or more layers of the above conductive films can be used.

Regarding the formation of the conductive film, film formation is performed according to a method which is selected as appropriate from among, for example, wet methods such as a printing method and a coating method, physical methods such as a vacuum deposition method, a sputtering method, and an ion plating method, and chemical methods such as CVD and a plasma CVD method, in consideration of the suitability to the material used.

The film thickness of the conductive film to be formed is preferably from 10 nm to 1000 nm, and more preferably from 50 nm to 500 nm, considering the film-formation property, patterning property by etching or a lift-off method, electric conductivity, and the like.

Subsequently, the conductive layer thus formed is subjected to patterning to give a predetermined shape by etching or a lift-off method, thereby forming the source electrode 16 and drain electrode 18. In this process, it is preferable that patterning of wires, which are connected to the source electrode 16 or the drain electrode 18, is performed simultaneously.

—Gate Insulating Film—

After forming the source electrode 16, drain electrode 18, and wires, a gate insulating film 20 is formed.

The gate insulating film 20 is preferably a film having high insulating property, and may be, for example, an insulating film of $SiO_2$, $SiN_x$, $SiON$, $Al_2O_3$, $Y_2O_3$, $Ta_2O_5$, $HfO_2$, or the like, or may be an insulating film containing at least two of these compounds. The gate insulating film 20 is formed according to a method which is selected as appropriate from among, for example, wet methods such as a printing method and a coating method, physical methods such as a vacuum deposition method, a sputtering method, and an ion plating method, and chemical methods such as CVD and a plasma CVD method, in consideration of the suitability to the material used.

Next, as needs arise, the gate insulating film 20 is subjected to patterning to give a predetermined shape by photolithography and etching.

Note that, the gate insulating film 20 should be thick enough to reduce the leak current and to improve the voltage resistance; however, when the gate insulating film is too thick, a rise in drive voltage occurs.

Although it depends on the material of the gate insulating film, the thickness of the gate insulating film is preferably from 10 nm to 10 μm, more preferably from 50 nm to 1000 nm, and particularly preferably from 100 nm to 400 nm.

—Gate Electrode—

After forming the gate insulating film 20, a gate electrode 22 is formed.

For the gate electrode 22, a material having high electric conductivity is used, and the gate electrode can be formed by using, for example, a metal such as Al, Mo, Cr, Ta, Ti, or Au, Al—Nd, an Ag alloy, or a metal oxide conductive film of tin oxide, zinc oxide, indium oxide, indium tin oxide (ITO), or indium zinc oxide (IZO), or the like. As the gate electrode 22, a monolayer structure or a laminate structure of two or more layers of the above conductive films can be used.

The gate electrode 22 is formed according to a method which is selected as appropriate from among, for example, wet methods such as a printing method and a coating method, physical methods such as a vacuum deposition method, a sputtering method, and an ion plating method, and chemical methods such as CVD and a plasma CVD method, in consideration of the suitability to the material used. The film thickness of the conductive film to be formed is preferably from 10 nm to 1000 nm, and more preferably from 50 nm to 500 nm, considering the film-formation property, patterning property by etching or a lift-off method, electric conductivity, and the like.

After the film formation, the conductive layer is subjected to patterning to give a predetermined shape by etching or a lift-off method, thereby forming the gate electrode 22. In this process, it is preferable that the patterning of the gate electrode 22 is performed simultaneously with the patterning of gate wires.

By the procedure described above, TFT 10 which exhibits favorable TFT properties such as a high on-off ratio, a high mobility, or the like can be produced, as shown in FIG. 2A. Note that, the case of applying the method for producing the amorphous oxide thin film 8 according to the exemplary embodiment of the invention to the formation of the active layer 14 is explained; however, it is also possible to use the method for producing the amorphous oxide thin film 8 according to the exemplary embodiment of the invention for the formation of the gate insulating film 20, gate electrode 22, source electrode 16, or drain electrode 18, and to use a conventional method for the formation of the active layer 14. Alternatively, the method for producing the amorphous oxide thin film 8 according to the exemplary embodiment of the invention may be used for the formation of the active layer 14 together with the formation of any of the gate insulating film 20, gate electrode 22, source electrode 16, or drain electrode 18.

This is because, since the binding state of oxygen, which is thought to control the electric physical properties of the oxide, in the substance produced by the liquid phase method according to the exemplary embodiment of the invention is similar to that in the substance produced by vacuum film-formation, as described above, not only improvement in membrane properties of a semiconductor film, but also improvement in membrane properties (improvement in mobility) of a conductive film such as the gate electrode 22, source electrode 16, or drain electrode 18, or improvement in membrane properties (suppression of leak current) of an insulating film such as the gate insulating layer 20 may be achieved.

3. Application

The application of the TFT according to the exemplary embodiment of the invention as described above is not particularly limited, and the TFT according to the exemplary embodiment of the invention is preferably used, for example, for a driving device of optoelectric devices, especially, for large-area devices.

Further, the TFT according to the exemplary embodiment of the invention is particularly preferably used for devices (for example, flexible displays or the like) which can be produced by a low-temperature process using a resin substrate, and is preferably used as a driving device (driving circuit) of various electronic devices, such as various sensors, for example, X-ray sensors, or MEMS (Micro Electro Mechanical System).

4. Optoelectric Device and Sensor

The optoelectric device and the sensor are each configured to include the TFT according to the exemplary embodiment of the invention.

Examples of the optoelectric device include display devices such as liquid crystal display devices, organic EL (Electro Luminescence) display device, or inorganic EL display devices.

Preferable examples of the sensor include image sensors, such as CCD (Charge Coupled Device) or CMOS (Complementary Metal Oxide Semiconductor), and X-ray sensors.

The optoelectric device and sensor, which use the TFT according to the exemplary embodiment of the invention, each exhibit high in-plane uniformity in properties. Note that, the term "properties" used herein refers to the display properties when used in connection with an optoelectric device (display device), and refers to the sensitivity properties when used in connection with a sensor.

Hereinafter, as representative examples of the optoelectric device and sensor equipped with the TFT, which is produced by the exemplary embodiment of the invention, a liquid crystal display device, an organic EL display device, and an X-ray sensor are explained.

5. Liquid Crystal Display Device

Figure 3:
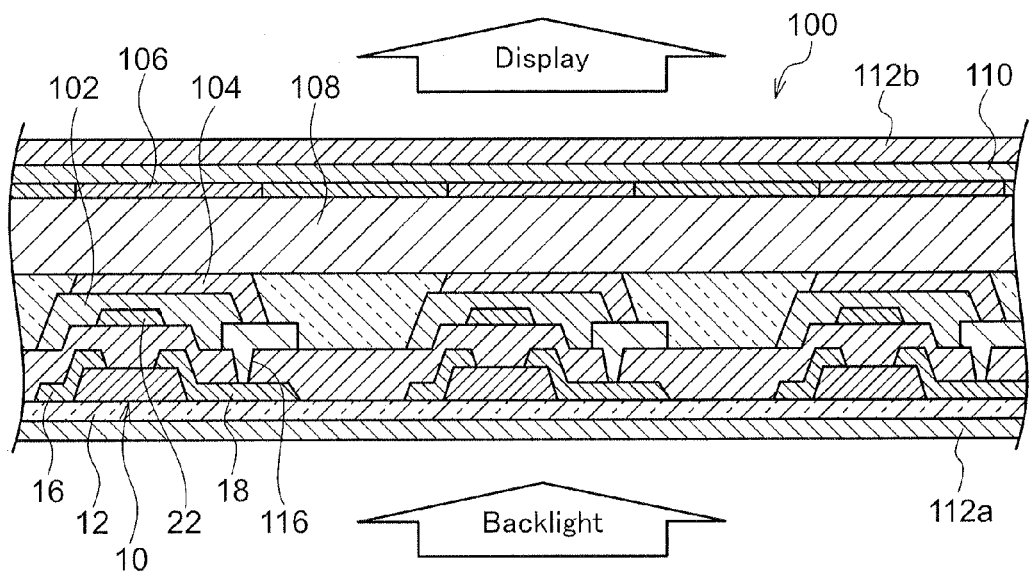
FIG. 3 is a conceptual sectional view of a part of a liquid crystal display device, which is an exemplary embodiment of an optoelectric device according to the present invention.
Figure 4:
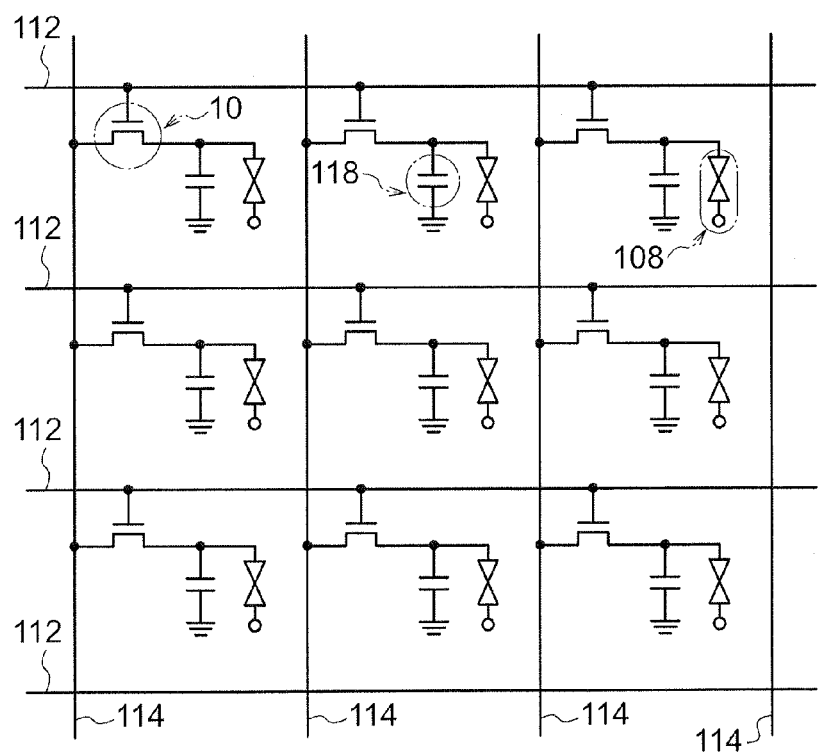
FIG. 4 is a schematic diagram of an electric wiring of the liquid crystal display device shown in FIG. 3.

A conceptual sectional view of a part of a liquid crystal display device, which is an exemplary embodiment of the optoelectric device according to the present invention, is shown in FIG. 3, and a schematic diagram of electric wiring thereof is shown in FIG. 4.

As shown in FIG. 3, a liquid crystal display device 100 according to the exemplary embodiment of the invention is equipped with a top contact type TFT 10 with a top gate structure as shown in FIG. 2A, and on the gate electrode 22 which is protected by a passivation layer 102 of the TFT 10, a liquid crystal layer 108 which is interposed between a pixel lower electrode 104 and an opposing upper electrode 106, and an RGB color filter 110 for forming different colors corresponding to the respective pixels, and further equipped with polarizing plates 112a and 112b on the side of substrate 12 of the TFT 10 and on the RGB color filter 110, respectively.

Further, as shown in FIG. 4, the liquid crystal display device 100 according to the exemplary embodiment of the invention is equipped with plural gate wires 112 which are parallel to each other and data wires 114 which are parallel to each other and are intersected with the gate wires 112. Here, the gate wires 112 are electrically insulated from the data wires 114. TFT 10 is disposed in the vicinity of an intersection portion of a gate wire 112 and a data wire 114.

In FIG. 3 and FIG. 4, the gate electrode 22 of the TFT 10 is connected to the gate wire 112, and the source electrode 16 of the TFT 10 is connected to the data wire 114. Further, the drain electrode 18 of the TFT 10 is connected to the pixel lower electrode 104 through a contact hole 116 (the contact hole 116 is filled with a conductive material) provided in the gate insulating film 20. The pixel lower electrode 104 forms a part of a capacitor 18 together with the earthed opposing upper electrode 106.

The liquid crystal device according to the exemplary embodiment of the invention shown in FIG. 3 is equipped with THT 10 having a top gate structure; however, the structure of the TFT used in the liquid crystal device, which is a display device according to the present invention, is not limited to the top gate structure, and the TFT may be a TFT having a bottom gate structure.

Since the TFT according to the exemplary embodiment of the invention exhibits an extremely high on-off ratio, a stable liquid crystal display device can be obtained.

6. Organic EL Display Device

Figure 5:
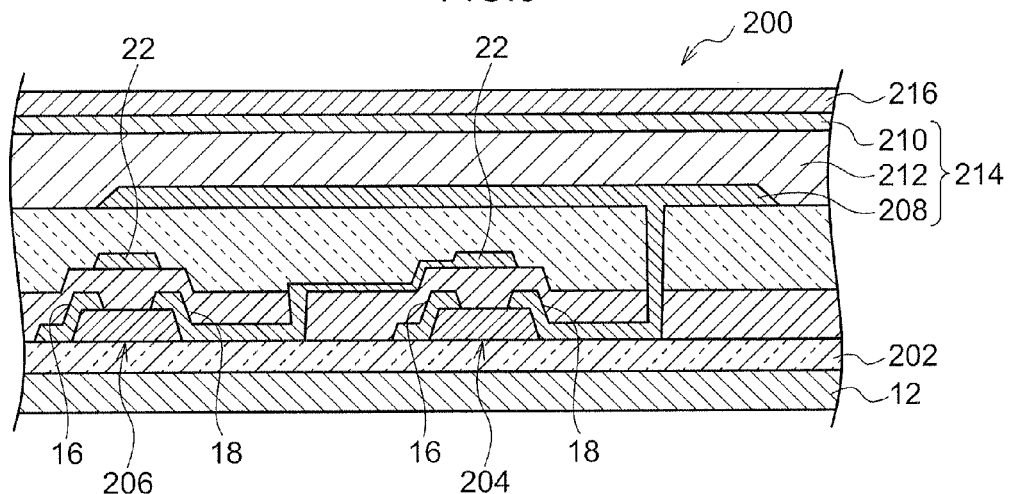
FIG. 5 is a conceptual sectional view of a part of an active matrix type organic EL display device, which is an exemplary embodiment of an optoelectric device according to the present invention.
Figure 6:
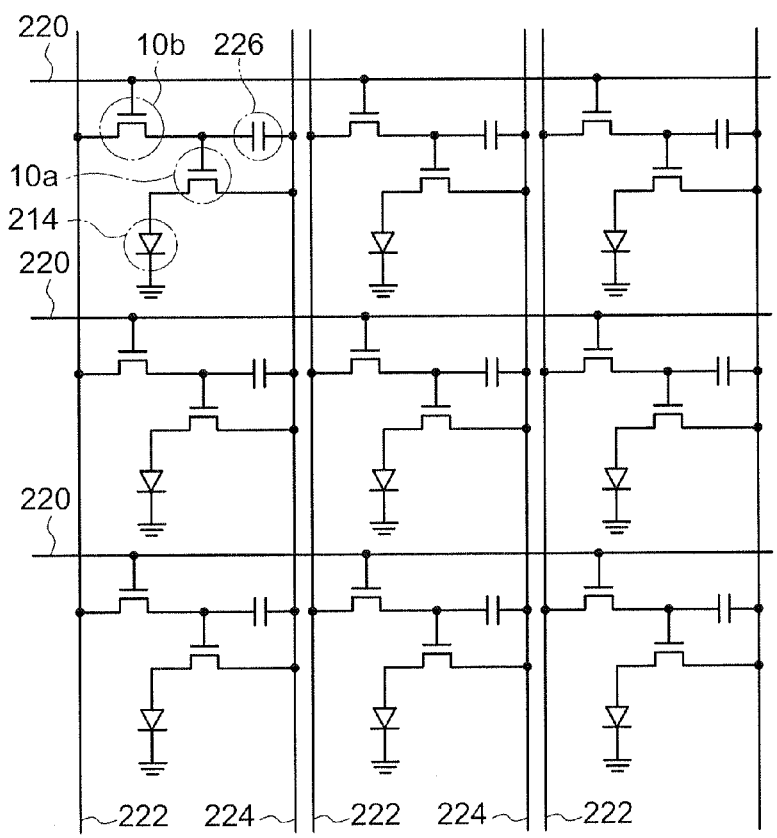
FIG. 6 is a schematic diagram of an electric wiring of the optoelectric device shown in FIG. 5.

A conceptual sectional view of a part of an active matrix type organic EL display device, which is an exemplary embodiment of the optoelectric device according to the present invention, is shown in FIG. 5, and a schematic diagram of electric wiring thereof is shown in FIG. 6.

In organic EL display devices, there are two kinds of driving systems, namely, a simple matrix system and an active matrix system. The simple matrix system has an advantage of being able to be produced at a low cost, but since a pixel is made to emit light by selecting every one scanning line, the emission time per one scanning line is inversely proportional to the number of scanning lines. Therefore, it is difficult to realize high definition and a large size. In the active matrix system, since a transistor or a capacitor is formed for every pixel, the production cost is high, but there are no problems such that the number of scanning lines cannot be increased, as the case of the simple matrix system, and thus, the active matrix system is suitable for realizing high definition and a large size.

An active matrix type organic EL display device 200 according to the exemplary embodiment of the invention is equipped with TFT 10 having a top gate structure as shown in FIG. 2A, on the substrate 12 having thereon a passivation layer 202, as a driving TFT 204 and a switching TFT 206; and is further equipped with an organic EL luminescence element 214 which includes an organic luminescence layer 212 interposed between a lower electrode 208 and an upper electrode 210, on the TFT 204 and TFT 206; and the upper face is also protected by a passivation layer 216.

As shown in FIG. 6, the organic EL display device 200 according to the exemplary embodiment of the invention is equipped with plural gate wires 220 which are parallel to each other, and data wires 222 and drive wires 224, which are parallel to each other and are intersected with the gate wires 220. Here, the gate wires 220 are electrically insulated from the data wires 222 and the drive wires 224. In FIG. 5 and FIG. 6, the gate electrode 22 of the switching TFT 10b is connected to the gate wire 220, and the source electrode 16 of the switching TFT 10b is connected to the data wire 222. Further, by connecting the drain electrode 18 of the switching TFT 10b to the gate electrode 22 of the driving TFT 10 and using a capacitor 226, a driving TFT 10a is kept in the on-state. The source electrode 16 of the driving TFT 10a is connected to a drive wire 224, and the drain electrode 18 is connected to the organic EL luminous element 214.

The organic EL device according to the exemplary embodiment of the invention shown in FIG. 5 is equipped with the TFT 10a and TFT 10b which have a top gate structure; however, the structure of the TFT used in the organic EL device, which is a display device according to the present invention, is not limited to the top gate structure, and the TFT may be a TFT having a bottom gate structure.

Since the TFT produced by the exemplary embodiment of the invention exhibits an extremely high on-off ratio, a stable organic EL display can be obtained.

In the organic EL display device shown in FIG. 5, the upper electrode 210 may be a transparent electrode to produce a top emission type organic EL display device, or the lower electrode 208 and the respective electrodes of the TFT may be transparent electrodes to produce a bottom emission type organic EL display device.

7. X-ray Sensor

Figure 7:
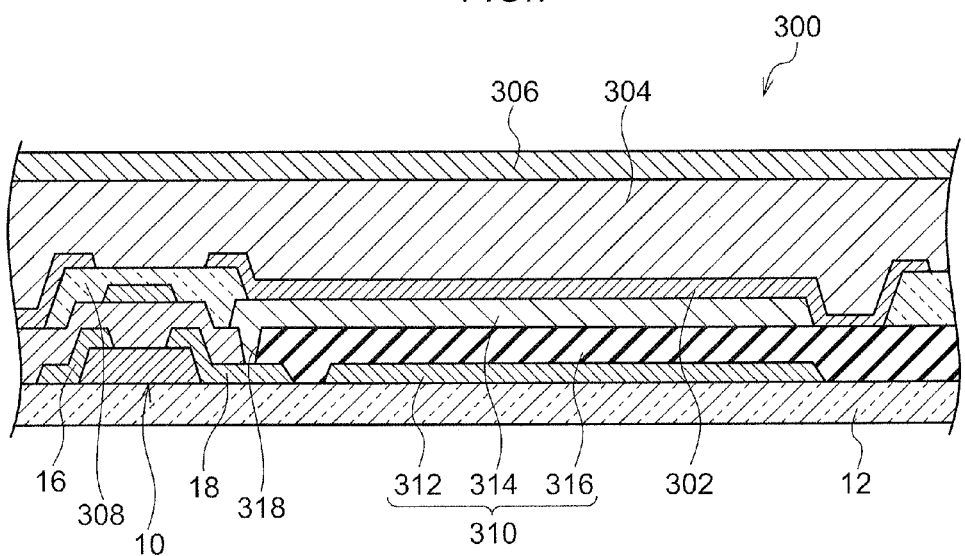
FIG. 7 is a conceptual sectional view of a part of an X-ray sensor, which is an exemplary embodiment of a sensor according to the present invention.
Figure 8:
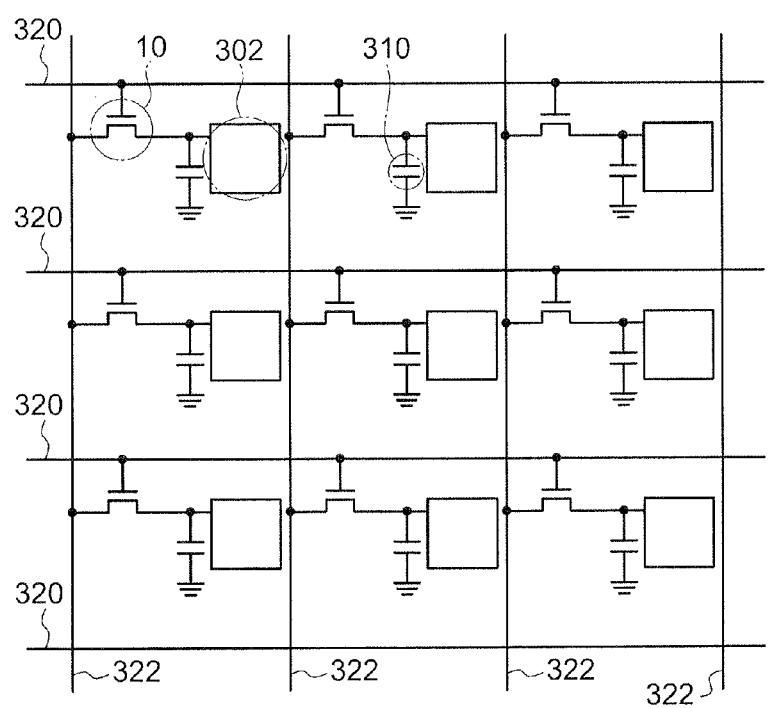
FIG. 8 is a schematic diagram of an electric wiring of the sensor shown in FIG. 7.

A conceptual sectional view of a part of an X-ray sensor, which is an exemplary embodiment of the sensor according to the present invention, is shown in FIG. 7, and a schematic diagram of electric wiring thereof is shown in FIG. 8.

More specifically, FIG. 7 is an enlarged conceptual sectional view showing a part of an X-ray sensor array. The X-ray sensor 300 according to the exemplary embodiment of the invention is equipped with TFT 10 and a capacitor 310 which are disposed on the substrate 12, an electric charge-collecting electrode 302 which is formed on the capacitor 310, an X-ray conversion layer 304, and an upper electrode 306. On the TFT 10, a passivation film 308 is provided.

The capacitor 310 has a configuration in which an insulating film 316 is interposed between a capacitor-lower electrode 312 and a capacitor-upper electrode 314. The capacitor-upper electrode 314 is connected to either the source electrode 16 or the drain electrode 18 of the TFT 10 (in FIG. 7, to the drain electrode 18), through a contact hole 318 provided in the insulating film 316.

The electric charge-collecting electrode 302 is provided on the capacitor-upper electrode 314 in the capacitor 310, and is in contact with the capacitor-upper electrode 314.

The X-ray conversion layer 304 is a layer including amorphous selenium, and is provided so as to cover the TFT 10 and the capacitor 310.

The upper electrode 306 is provided on the X-ray conversion layer 304, and is in contact with the X-ray conversion layer 304.

As shown in FIG. 8, the X-ray sensor 300 according to the exemplary embodiment of the invention is equipped with plural gate wires 320 which are parallel to each other and plural data wires 322 which are parallel to each other and are intersected with the gate wires 320. Here, the gate wires 320 are electrically insulated from the data wires 322. TFT 10 is disposed in the vicinity of an intersection portion of a gate wire 320 and a data wire 322.

The gate electrode 22 of the TFT 10 is connected to the gate wire 320, and the source electrode 16 of the TFT 10 is connected to the data wire 322. Further, the drain electrode 18 of the TFT 10 is connected to the electric charge-collecting electrode 302, and further, the electric charge-collecting electrode 302 is connected to the capacitor 310.

In the X-ray sensor 300 according to the exemplary embodiment of the invention, X-rays are irradiated from the upper part (from the upper electrode 306 side) in FIG. 7, and electron-hole pairs are generated in the X-ray conversion layer 304. When a high electric field is applied to the X-ray conversion layer 304 by the upper electrode 306, the generated charges are accumulated in the capacitor 310, and are read out by sequentially scanning the TFT 10.

Since the X-ray sensor 300 according to the exemplary embodiment of the invention in equipped with TFT 10 having high in-plane uniformity and excellent reliability, images with excellent uniformity can be obtained.

The X-ray sensor according to the exemplary embodiment of the invention shown in FIG. 7 is equipped with a TFT having a top gate structure; however, the structure of the TFT used in the sensor according to the present invention is not limited to the top gate structure, and the TFT may be a TFT having a bottom gate structure.

<Modification Examples>

The present invention is explained in detail on the basis of specific exemplary embodiments; however, the present invention is not limited to these exemplary embodiments, and it is apparent to one of ordinary skill in the art that other various exemplary embodiments are possible within the scope of the present invention; for example, the above-described plural exemplary embodiments can be carried out by combining them appropriately. Further, the following modification examples may be combined appropriately.

For example, the whole or a part of the substrate providing process, formation process, or additional process described above may be omitted as appropriate.

Further, in the post-treatment process, for example, light irradiation may be carried out simultaneously with the heat treatment.

EXAMPLES

Hereinafter, the examples are explained, but it should be construed that the present invention is in no way limited to these Examples.

<Example of Metal Alkoxide System>

—Preparation and Examination of First Oxide Precursor Film and Second Oxide Precursor Film—

2.2 g of zinc acetate dihydrate, 2.47 g of gallium isopropoxide, and 2.74 g of indium isopropoxide were weighed, and were added to diethylethanolamine and the mixture was stirred at a temperature of 150° C., to obtain a light-yellow metal alkoxide-based raw material liquid (IGZO solution). The composition ratio of In, Ga, and Zn was found to be 1.0:1.0:0.9 by ICP measurement. Further, with regard to the dry gel of the obtained IGZO solution, TG-DTA was carried out.

Figure 9:
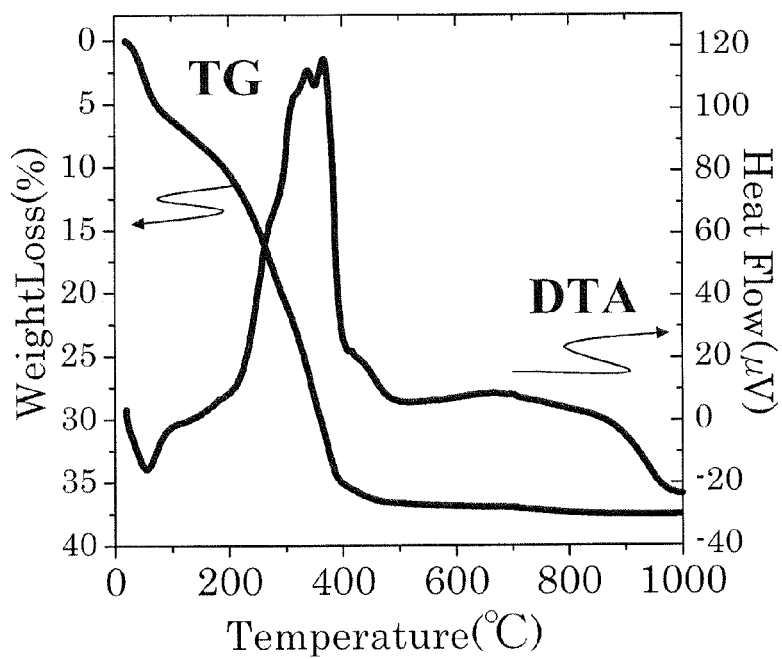
FIG. 9 is a diagram showing the results of measurement of TG-DTA with respect to the dry gel in the Examples.

FIG. 9 is a diagram showing the results of measurement of TG-DTA with respect to the dry gel in the Examples.

Per the measurement results shown in FIG. 9, in the range of from room temperature to about 400° C., the weight loss accompanying the endothermic reaction occurs rapidly. Further, it is understood that, in the range of higher than 400° C. but lower than 425° C., the weight loss is moderate, and at about 425° C., the weight loss accompanying the endothermic reaction is terminated. It is thought that the temperatures of 400° C. and 425° C. correspond to the thermal decomposition temperatures of the organic components of the dry gel.

Subsequently, on a quartz substrate, the above IGZO solution was spin-coated twice at a speed of 1000 rpm, and was dried at room temperature, thereby forming a first oxide precursor film in a gel state. Then, evaluation of the first oxide precursor film thus obtained was performed by XRD.

Figure 10:
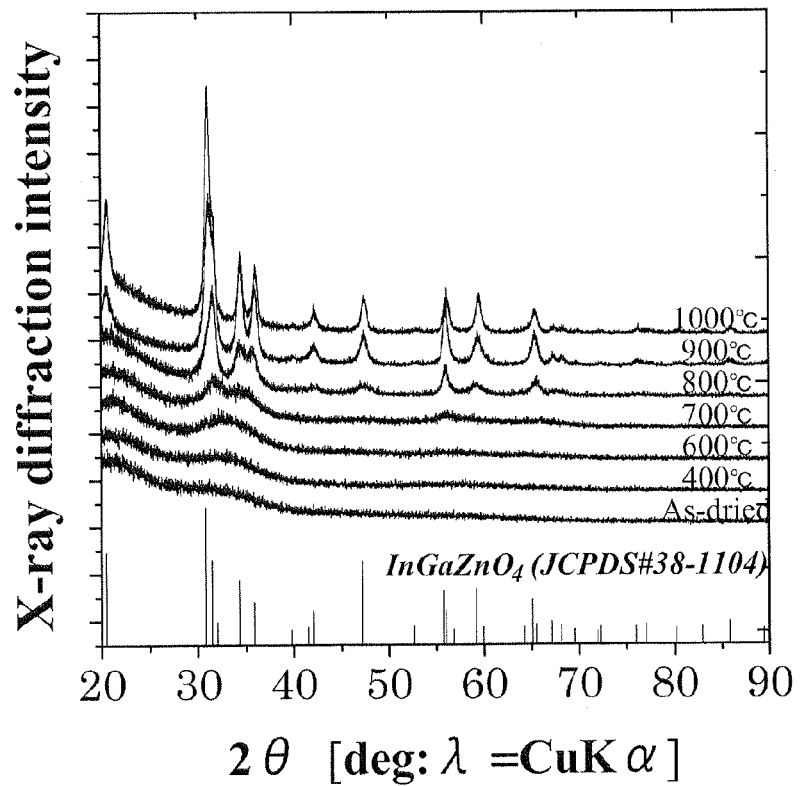
FIG. 10 shows the results of measurement of XRD with respect to the first oxide precursor films in the Examples.

FIG. 10 shows the results of measurement of XRD with respect to the first oxide precursor films of the Example.

As shown in FIG. 10, in the first oxide precursor film which has only been dried at room temperature, only a pattern which indicates an amorphous substance is obtained. Further, when the XRD baking temperature dependency of this first oxide precursor film is analyzed, it is confirmed that the film subjected to 1000° C. baking has an $InGaZnO_4$ crystal structure; regarding the film subjected to 800° C. baking, while a weak peak is seen and thus, it is presumed that there is a partial crystalline portion, the film is in a state in which an amorphous portion and a crystalline portion coexist; regarding the film subjected to 700° C. baking, while a clear peak is not seen and thus, it is presumed that an extremely small crystalline portion is present, the film is in a state in which an amorphous portion and a crystalline portion coexist; and regarding the films subjected to baking at a temperature equal to or lower than 600° C., when analyzed only from the results shown in FIG. 10, the films exist as a completely amorphous substance.

Next, with respect to plural first oxide precursor films that had only been dried at room temperature, UV ozone treatment was performed as a pre-treatment process, by varying the irradiation time as 1 minute, 3 minutes, 5 minutes, 10 minutes, 30 minutes, 60 minutes, and 90 minutes, respectively, thereby obtaining second oxide precursor films. In this UV ozone treatment, a low pressure mercury lamp (wavelength 185 nm and 254 nm) was used, in which the intensity of light at 254 nm was about 5 mW/cm$^2$.

With respect to the films before and after the above UV ozone treatment, XRF measurement was carried out, and it was revealed that the composition ratio of In, Ga, and Zn, and the coating amount were not changed before and after the treatment.

Further, with respect to the second oxide precursor films after the above UV ozone treatment, measurement of FT-IR (Fourier transform infrared spectroscopy) spectrum was carried out by using a measurement apparatus, apparatus name: BRUKER ALPHA, and using a diamond ATR configuration. Further, for comparison, plural first oxide precursor films that had only been dried at room temperature were subjected to heat treatment at various temperatures, instead of UV ozone treatment, and with respect to the resulting films, measurement of FT-IR (Fourier transform infrared spectroscopy) spectrum was carried out.

Figure 11:
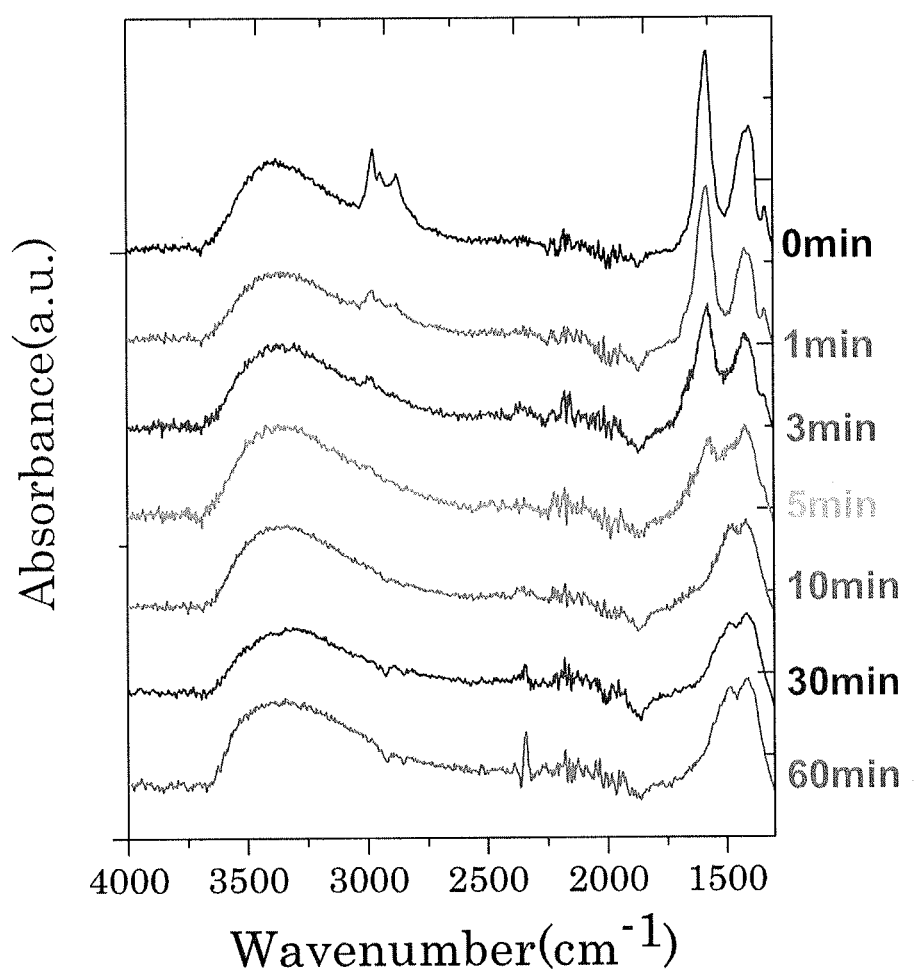
FIG. 11 is a diagram showing the results of measurement of FT-IR (Fourier transform infrared spectroscopy) spectrum with respect to the respective second oxide precursor films.
Figure 12:
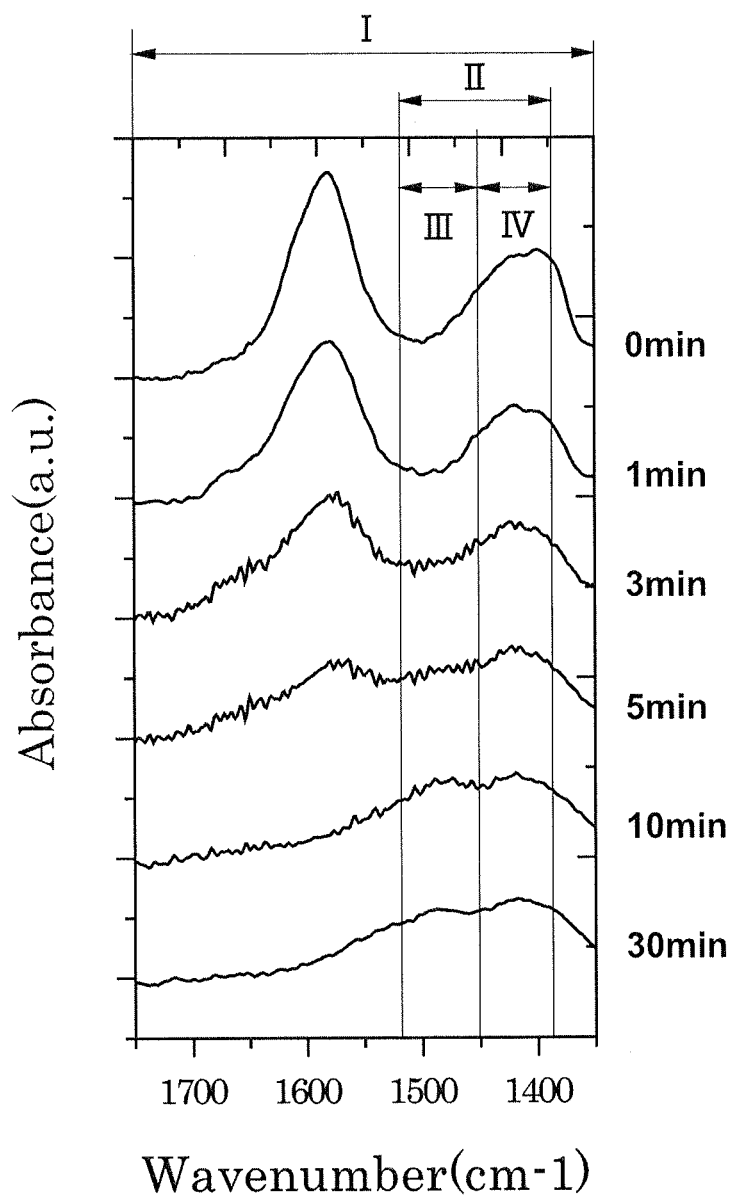
FIG. 12 is an enlarged view of the infrared absorption spectrum in an infrared wave number range of from 1350 $cm^{-1}$ to 1750 $cm^{-1}$ shown in FIG. 11.

FIG. 11 is a diagram showing the results of measurement of FT-IR (Fourier transform infrared spectroscopy) spectrum with respect to the respective second oxide precursor films. FIG. 12 is an enlarged view of the infrared absorption spectrum in an infrared wave number range of from 1350 cm$^{-1}$ to 1750 cm$^{-1}$ shown in FIG. 11.

Figure 13:
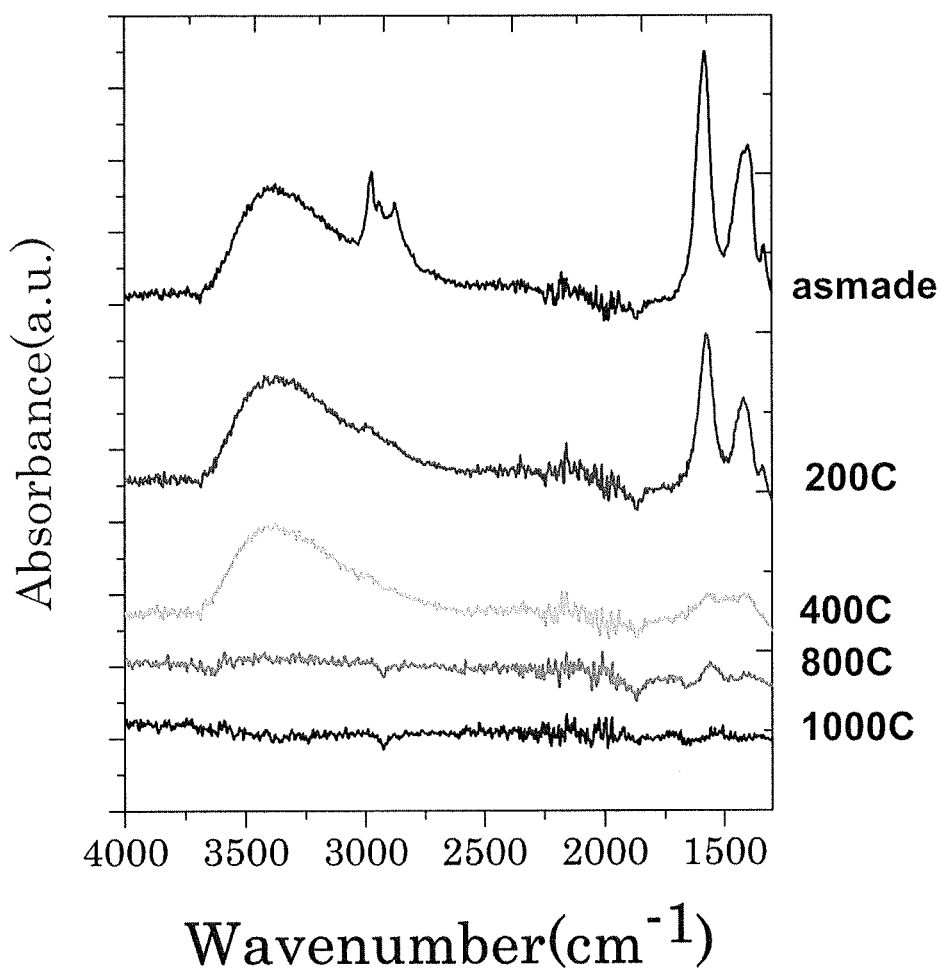
FIG. 13 is a diagram showing the results of measurement of FT-IR (Fourier transform infrared spectroscopy) spectrum with respect to the respective films after subjecting plural first oxide precursor films to heat treatment at various temperatures.

FIG. 13 is a diagram showing the results of measurement of FT-IR (Fourier transform infrared spectroscopy) spectrum with respect to the respective films after subjecting plural first oxide precursor films to heat treatment at various temperatures. It should be noted that, in FIG. 11, since the measurement result of FT-IR (Fourier transform infrared spectroscopy) spectrum with respect to the second oxide precursor film that has been subjected to UV ozone treatment for 90 minutes is the same as the measurement result for 60 minutes, the former measurement result is omitted in the diagram.

Figure 14:
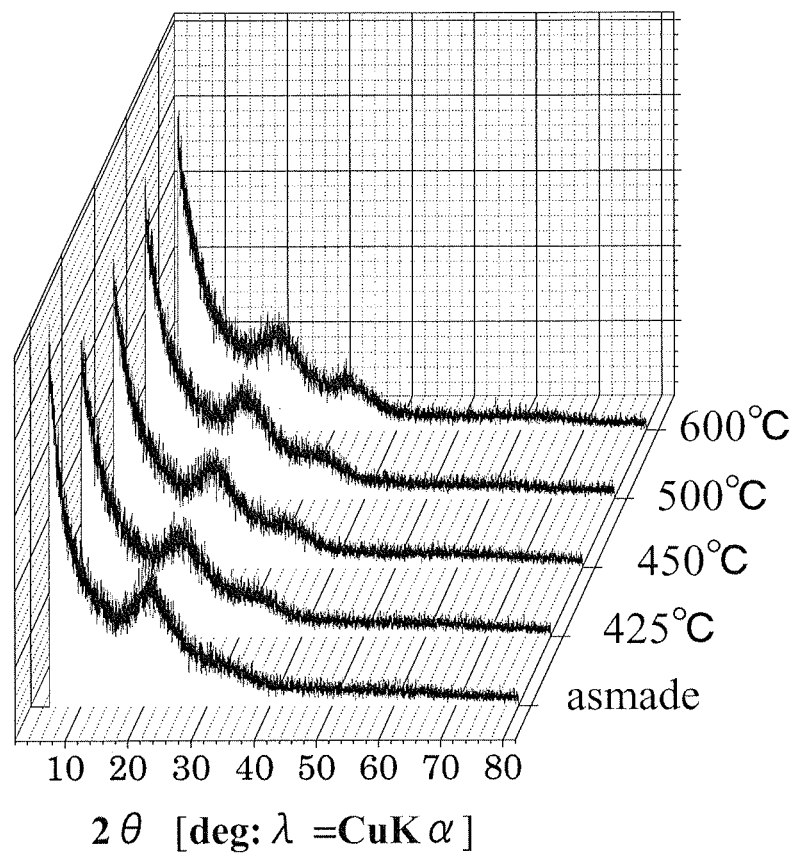
FIG. 14 is a diagram showing the results of measurement of XRD on samples that have been subjected to heat treatment after UV ozone treatment.
Figure 15:
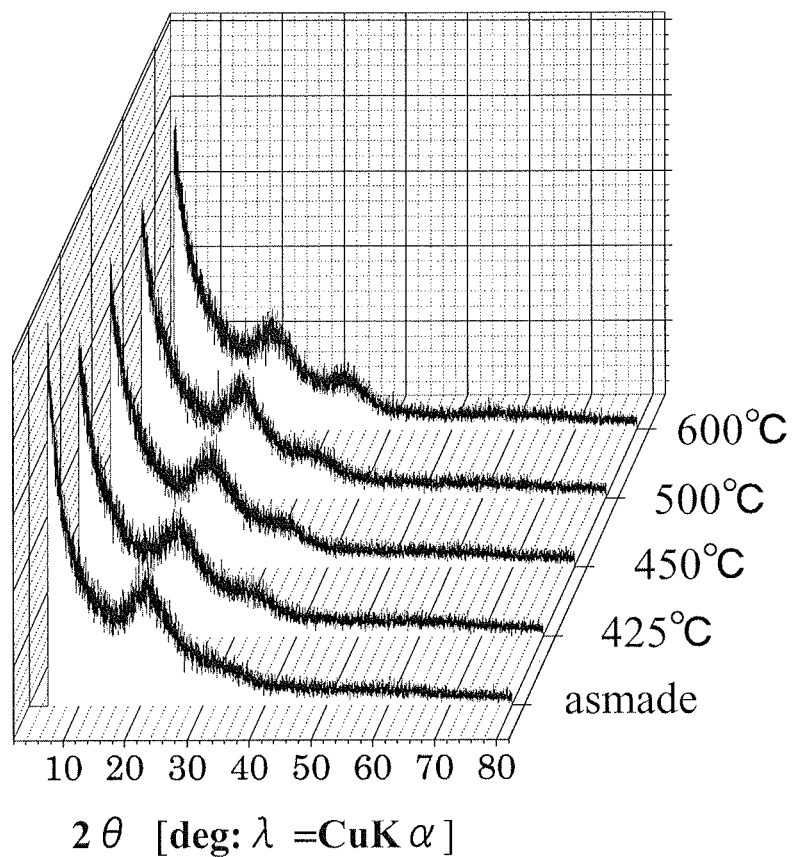
FIG. 15 is a diagram showing the results of measurement of XRD on samples that have not been subjected to UV ozone treatment.

As shown in FIG. 11, it is confirmed that the shape of a part of the peak in the FT-IR spectrum is changed with treatment time. Upon comparing the change in shape of the FT-IR spectra due to the UV ozone treatment and heat treatment with reference to FIG. 11 and FIG. 13, it is understood that, in the heat treatment, the peak is lowered on the whole, but in the UV ozone treatment, the shape of peak (the binding state of the organic component) is changed selectively. Further, it is confirmed by the measurement results of XRD that the samples that have been subjected to heat treatment at 600° C. or lower after UV ozone treatment (see FIG. 14) are completely in the amorphous state, similar to the samples that have not been subjected to UV ozone treatment (see FIG. 15).

Furthermore, as shown in FIG. 12, when the irradiation time of the UV ozone treatment is less than 5 minutes, a peak positioned within the infrared wave number range of from 1500 cm$^{-1}$ to 1600 cm$^{-1}$ attains the maximum value in the infrared absorption spectrum within an infrared wave number range (I) of from 1350 cm$^{-1}$ to 1750 cm$^{-1}$. In contrast, it is understood that, when the irradiation time of the UV ozone treatment is equal to or more than 5 minutes, in an infrared absorption spectrum obtained when the second oxide precursor film is analyzed by Fourier transform infrared spectroscopy, a peak (double peak) positioned within the infrared wave number range (II) of from 1380 cm$^{-1}$ to 1520 cm$^{-1}$ attains the maximum value in the infrared absorption spectrum within the infrared wave number range (I) of from 1350 cm$^{-1}$ to 1750 cm$^{-1}$.

More specifically, when the irradiation time of the UV ozone treatment is equal to or more than 5 minutes, in an infrared absorption spectrum obtained when the second oxide precursor film is analyzed by Fourier transform infrared spectroscopy, when the infrared wave number range (II) of from 1380 cm$^{-1}$ to 1520 cm$^{-1}$ is divided into an infrared wave number range (IV) of from 1380 cm$^{-1}$ to 1450 cm$^{-1}$ and an infrared wave number range (III) of from more than 1450 cm$^{-1}$ to 1520 cm$^{-1}$, a peak positioned within the infrared wave number range (IV) of from 1380 cm$^{-1}$ to 1450 cm$^{-1}$ attains the maximum value in the infrared absorption spectrum within an infrared wave number range (I) of from 1350 cm$^{-1}$ to 1750 cm$^{-1}$.

Note that, in the infrared wave number range (IV) of from 1380 cm$^{-1}$ to 1450 cm$^{-1}$ and the infrared wave number range (III) of from more than 1450 cm$^{-1}$ to 1520 cm$^{-1}$, a double peak such that the peak straddles the two ranges is seen, and one peak of this double peak is a peak positioned within the above range (IV).

Further, as shown in FIG. 11, it is understood that, as a selective change of the change in the shape of a peak (the binding state of the organic component) in the UV ozone treatment, a lowering of a peak which is derived from the organic component and is positioned within an infrared wave number range of from 2750 cm$^{-1}$ to 3050 cm$^{-1}$ is also included, as the irradiation time of the UV ozone treatment is longer. Similarly, it is understood that, as a selective change of the change in the shape of a peak (the binding state of the organic component) in the UV ozone treatment, a lowering of a peak which is derived from the organic component and is positioned within an infrared wave number range of from 1500 cm$^{-1}$ to 1600 cm$^{-1}$ is also included, as the irradiation time of the UV ozone treatment is longer.

Below, correlations among irradiation time, total amount of energy, and the rate of lowering of a peak, which is derived from the organic component and is positioned within an infrared wave number range of from 1500 cm$^{-1}$ to 1600 cm$^{-1}$, are shown in Table 1.

TABLE 1

| UV Irradiation Time (min) | Total Amount of Energy @254 nm (J/cm$^2$) | Rate of Lowering of Peak I (1500-1600 cm$^{-1}$)/ I (1500-1600 cm$^{-1}$) |
|---|---|---|
| 0.00 | 0.00 | 1.00 |
| 1.00 | 0.30 | 0.76 |

TABLE 1-continued

| UV Irradiation Time (min) | Total Amount of Energy @254 nm (J/cm²) | Rate of Lowering of Peak I (1500-1600 cm⁻¹)/ I (1500-1600 cm⁻¹) |
|---|---|---|
| 3.00 | 0.90 | 0.59 |
| 5.00 | 1.50 | 0.37 |
| 10.00 | 3.00 | 0.11 |
| 20.00 | 6.00 | 0.11 |
| 30.00 | 9.00 | 0.11 |
| 60.00 | 18.00 | 0.11 or less |
| 90.00 | 27.00 | 0.11 or less |

—Production of Thin Film Transistor—

Next, a bottom gate-top contact type thin film transistor was produced, in order to evaluate how the state of the second oxide precursor film, which varies depending on the irradiation time of the UV ozone treatment, influences the thin film after heat treatment in terms of device properties.

Figure 16:
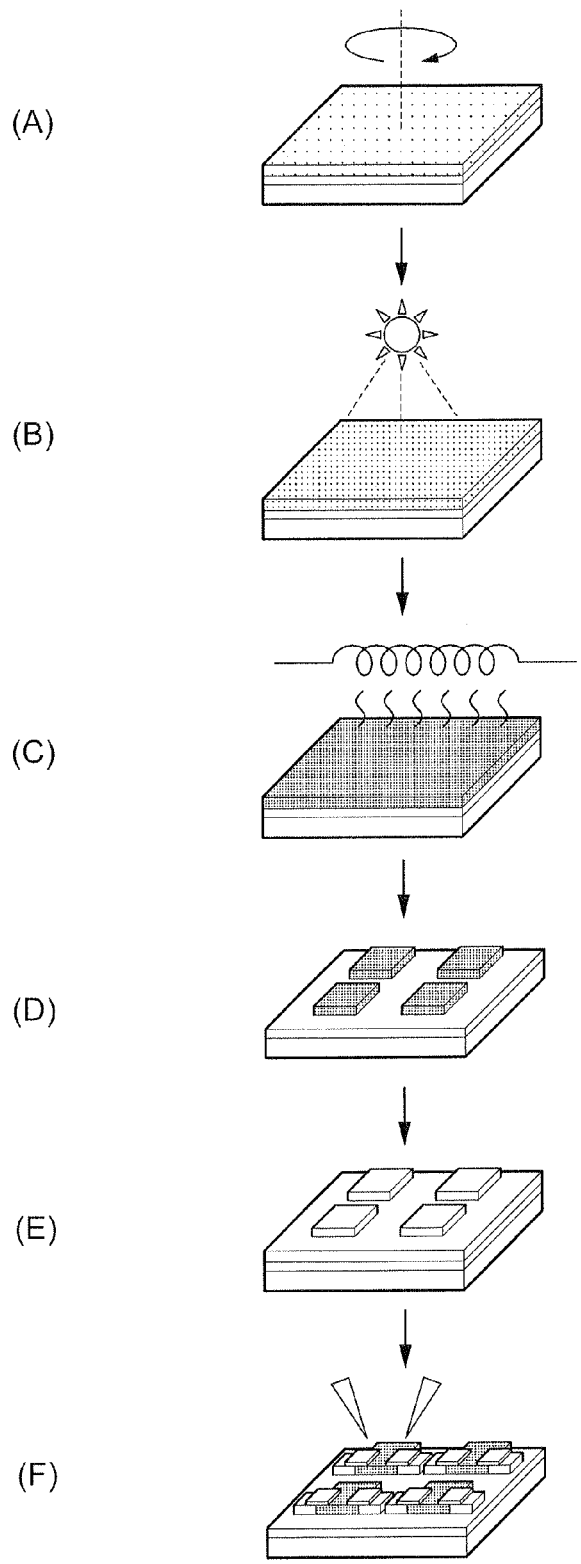
FIG. 16 is a process chart showing a method for producing a thin film transistor according to an Example of the present invention.

FIG. 16 is a process chart showing a method for producing a thin film transistor according to the Examples of the invention.

For the substrate of the thin film transistor according to the Examples of the invention, a P+Si/Si thermal oxide film (100 nm)-attached substrate was used, P+Si was used as the gate electrode, and an Si thermal oxide film was used as the gate insulating layer.

Next, in the processes shown in FIGS. 16 (A) to (C), an active layer was prepared by the same method as in the above-described method for obtaining a second oxide precursor film from a first oxide precursor film. Specifically, as shown in FIG. 16 (A), using an IGZO solution (the same solution as the raw material liquid described above; In:Ga:Zn=1.0:1.0:0.9), formation of the active layer was carried out by a spin coating method, such that the film thickness of the final product was about 50 nm (this is because the amount of the organic component decreases due to the heat treatment, whereby the film thickness varies). After the film formation, as shown in FIG. 16 (B), UV ozone treatment was carried out under various conditions as the pre-treatment process, and thereafter, as shown in FIG. 16 (C), heat treatment was carried out at a temperature within the range of from 400° C. to 600° C. for 15 minutes, as the post-treatment process. Then, as shown in FIG. 16 (D), the active layer was subjected to patterning by using photolithography and wet etching. TSMR 8900-LB was used as the resist, and oxalic acid was used as the etchant. For the development, a 5% solution of TMAH was used as the developing solution. The source and drain (100 nm) electrodes were formed with Mo by lift-off, as shown in FIG. 16 (E) and FIG. 16 (F). For the resist, AZ5214E was used.

—Evaluation of Transistor Properties and Mobility—

Next, the thin film transistor thus obtained was subjected to measurement of transistor properties (Vg-Id characteristics) and mobility μ, using a semiconductor parameter analyzer 4156 C (manufactured by Agilent Technologies Inc.). The Vg-Id characteristics were measured by changing the gate voltage (Vg) within a range of from −20 V to +40V at a fixed drain voltage (Vd) of 5 V, and measuring the drain current (Id) at each gate voltage (Vg).

Figure 17:
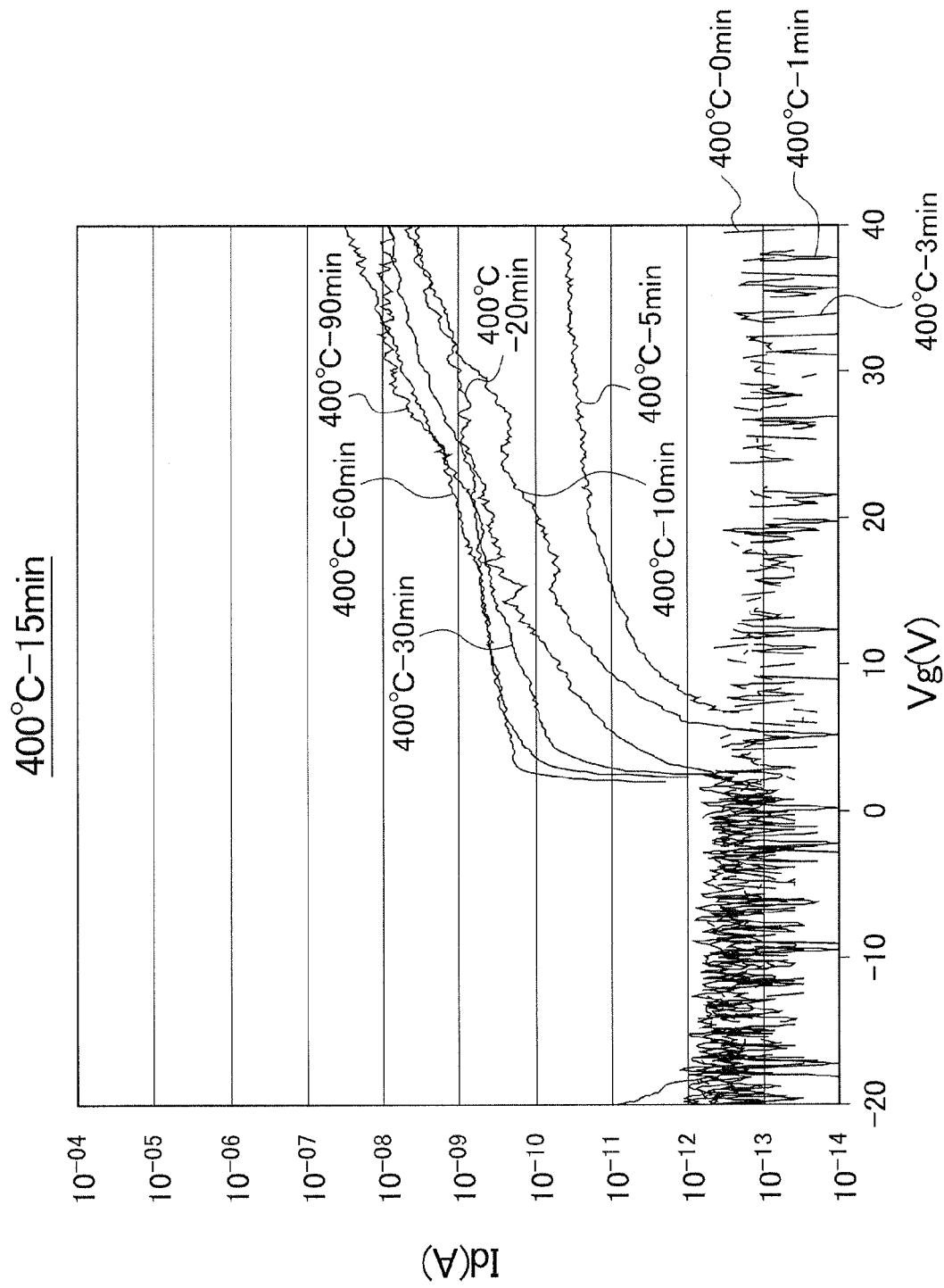
FIG. 17 is a diagram showing the Vg-Id characteristics of thin film transistors, when the heat treatment temperature is fixed at 400° C. and the UV irradiation time is varied as 0 min, 1 min, 3 min, 5 min, 10 min, 20 min, 30 min, 60 min, and 90 min, respectively.
Figure 18:
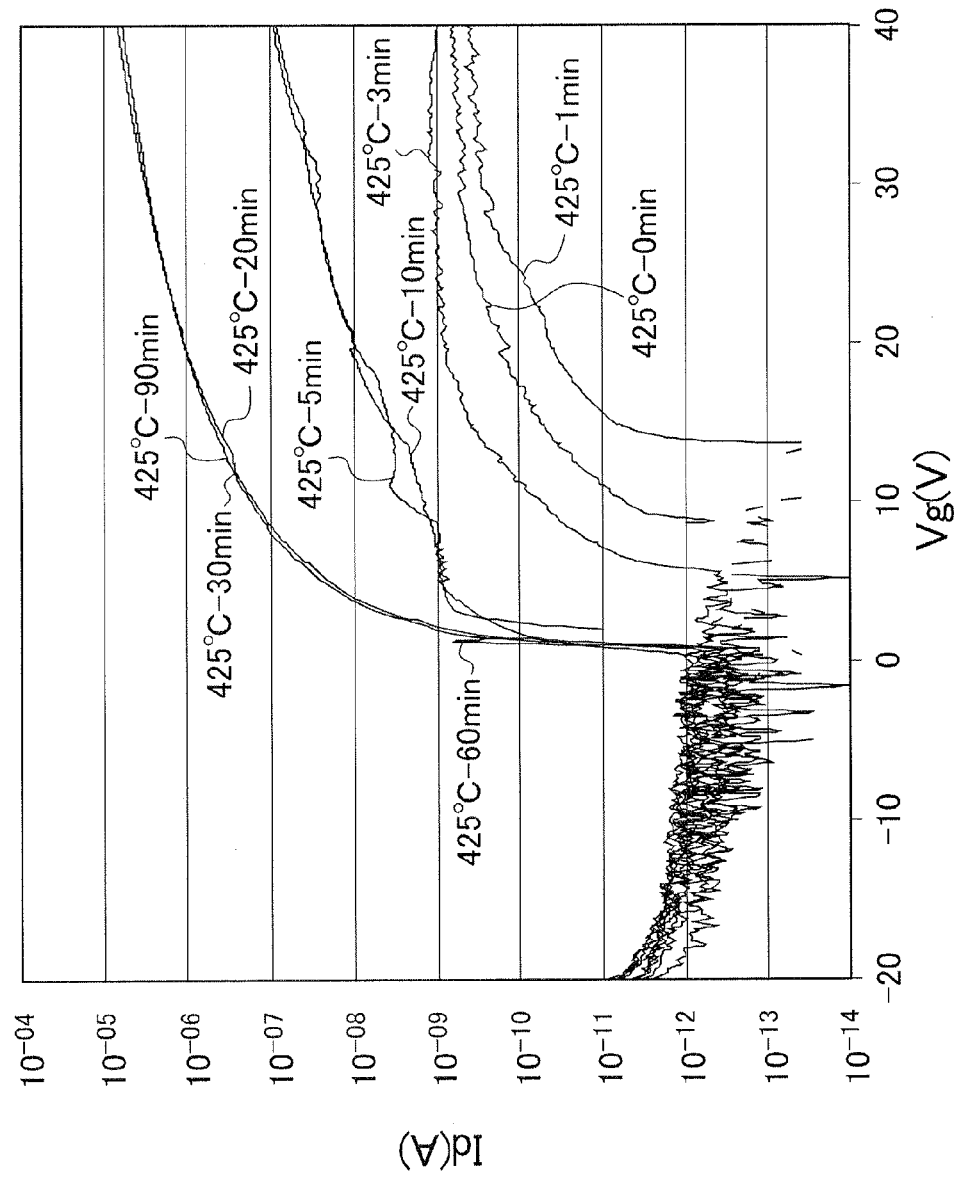
FIG. 18 is a diagram showing the Vg-Id characteristics of thin film transistors, when the heat treatment temperature is fixed at 425° C. and the UV irradiation time is varied as 0 min, 1 min, 3 min, 5 min, 10 min, 20 min, 30 min, 60 min, and 90 min, respectively.
Figure 19:
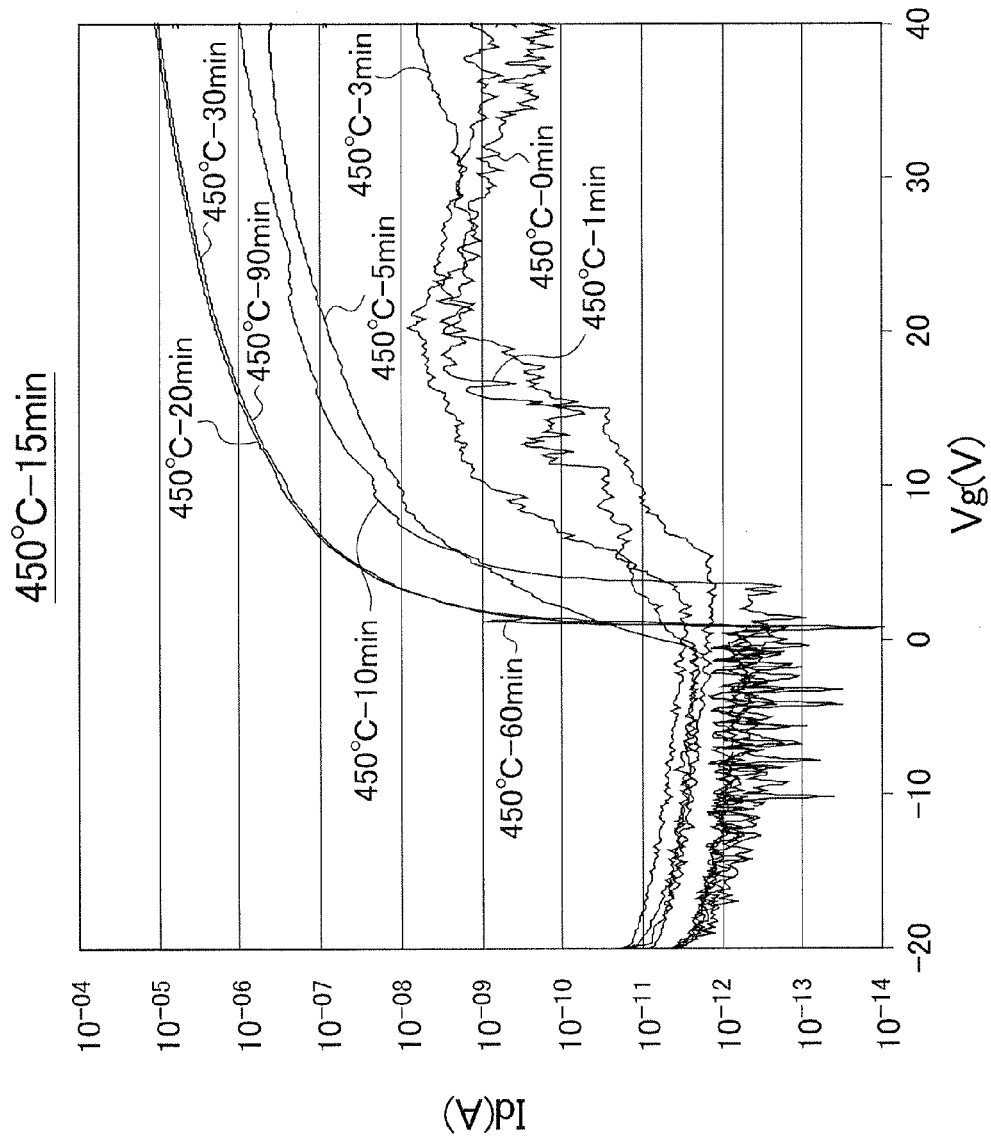
FIG. 19 is a diagram showing the Vg-Id characteristics of thin film transistors, when the heat treatment temperature is fixed at 450° C. and the UV irradiation time is varied as 0 min, 1 min, 3 min, 5 min, 10 min, 20 min, 30 min, 60 min, and 90 min, respectively.
Figure 20:
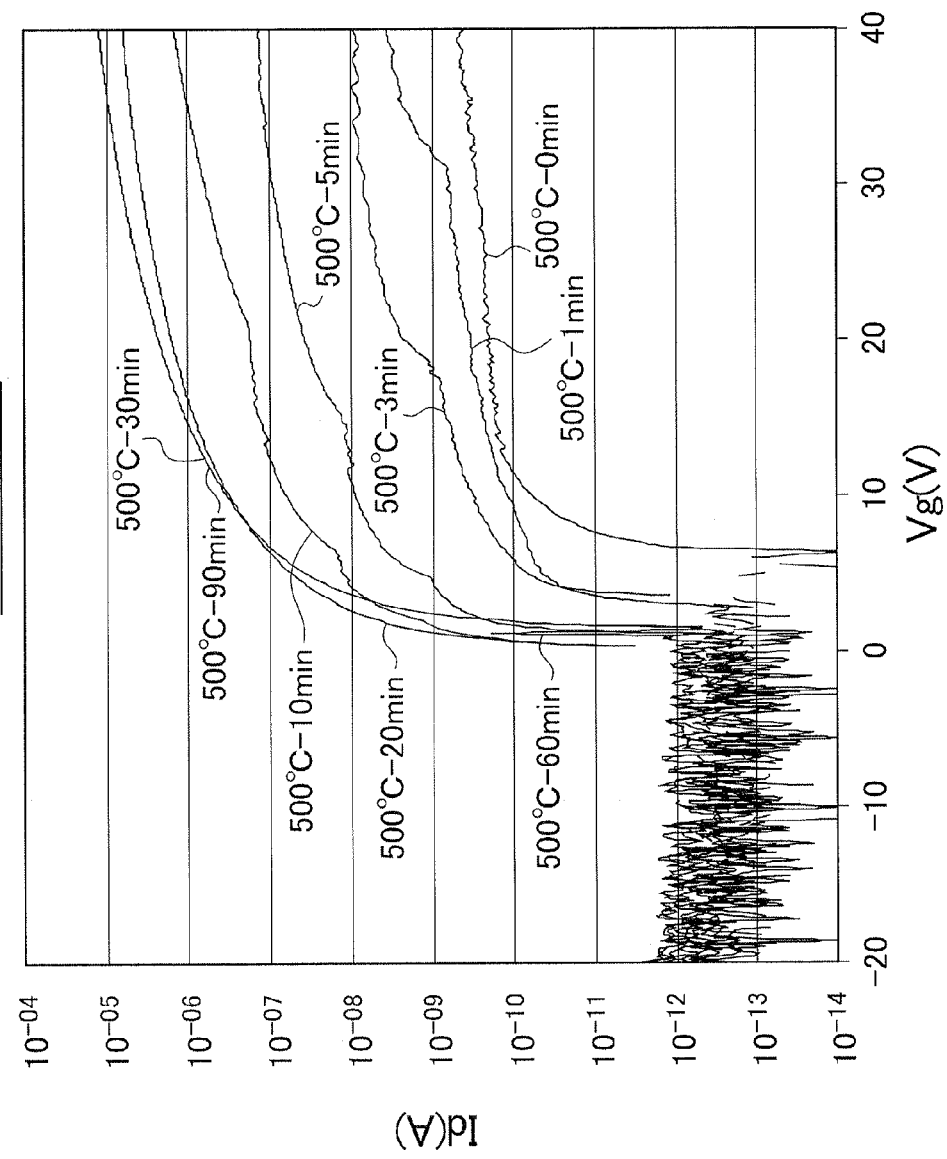
FIG. 20 is a diagram showing the Vg-Id characteristics of thin film transistors, when the heat treatment temperature is fixed at 500° C. and the UV irradiation time is varied as 0 min, 1 min, 3 min, 5 min, 10 min, 20 min, 30 min, 60 min, and 90 min, respectively.
Figure 21:
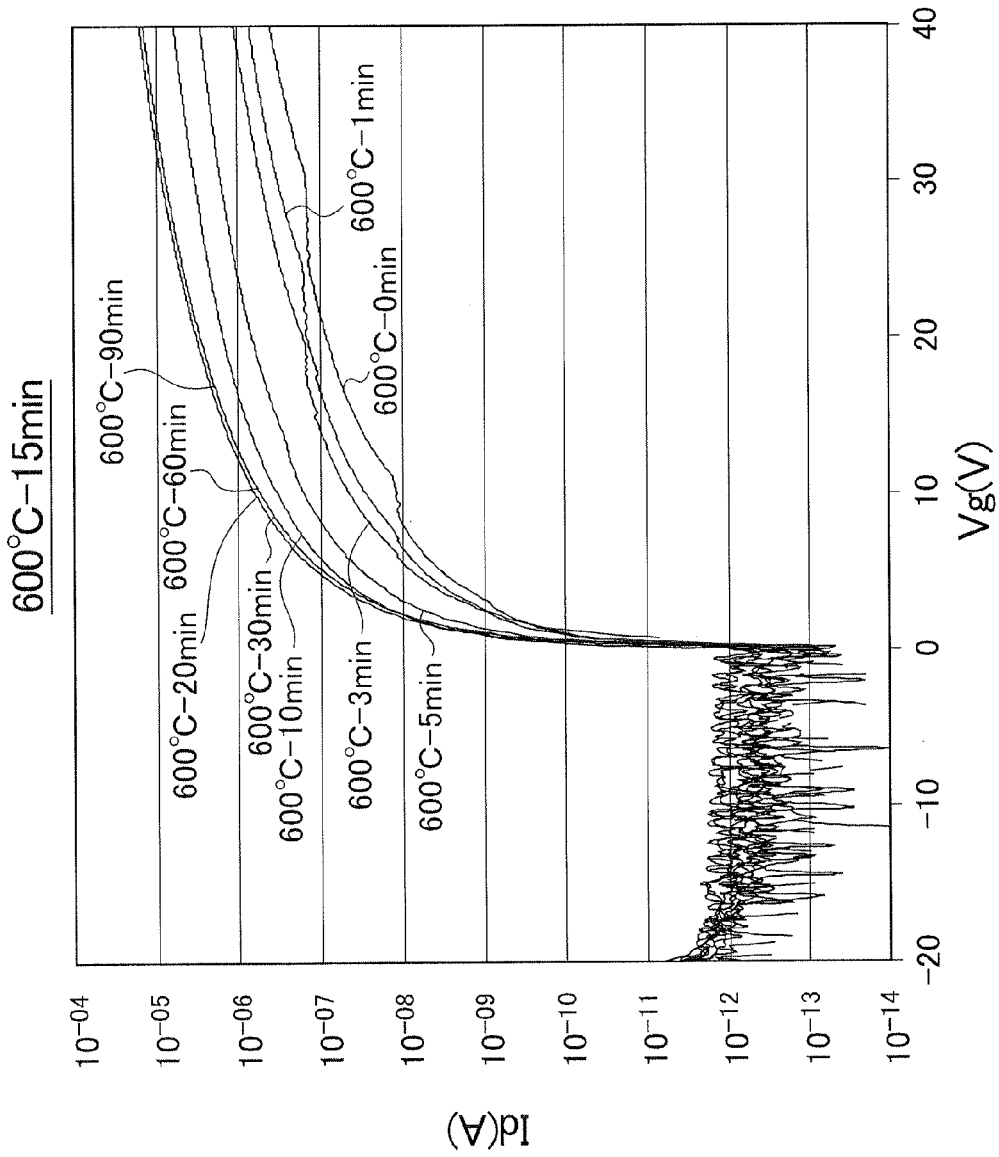
FIG. 21 is a diagram showing the Vg-Id characteristics of thin film transistors, when the heat treatment temperature is fixed at 600° C. and the UV irradiation time is varied as 0 min, 1 min, 3 min, 5 min, 10 min, 20 min, 30 min, 60 min, and 90 min, respectively.

FIG. 17 to FIG. 21 are diagrams showing the Vg-Id characteristics of the thin film transistors obtained in the Examples. Specifically, FIG. 17 is a diagram showing the Vg-Id characteristics of the thin film transistors, when the heat treatment temperature is fixed at 400° C. and the UV irradiation time is varied as 0 min, 1 min, 3 min, 5 min, 10 min, 20 min, 30 min, 60 min, and 90 min, respectively. FIG. 18 is a diagram showing the Vg-Id characteristics of the thin film transistors, when the heat treatment temperature is fixed at 425° C. and the UV irradiation time is varied as 0 min, 1 min, 3 min, 5 min, 10 min, 20 min, 30 min, 60 min, and 90 min, respectively. FIG. 19 is a diagram showing the Vg-Id characteristics of the thin film transistors, when the heat treatment temperature is fixed at 450° C. and the UV irradiation time is varied as 0 min, 1 min, 3 min, 5 min, 10 min, 20 min, 30 min, 60 min, and 90 min, respectively. FIG. 20 is a diagram showing the Vg-Id characteristics of the thin film transistors, when the heat treatment temperature is fixed at 500° C. and the UV irradiation time is varied as 0 min, 1 min, 3 min, 5 min, 10 min, 20 min, 30 min, 60 min, and 90 min, respectively. FIG. 21 is a diagram showing the Vg-Id characteristics of the thin film transistors, when the heat treatment temperature is fixed at 600° C. and the UV irradiation time is varied as 0 min, 1 min, 3 min, 5 min, 10 min, 20 min, 30 min, 60 min, and 90 min, respectively.

Note that, irrespective of the heat treatment temperature, the thin film transistor when the UV irradiation time is 0 min is referred to as the TFT of Comparative Example 1, the thin film transistor when the UV irradiation time is 1 min is referred to as the TFT of Comparative Example 2, and the thin film transistor when the UV irradiation time is 3 min is referred to as the TFT of Comparative Example 3. Further, irrespective of the heat treatment temperature, the thin film transistor when the UV irradiation time is 5 min is referred to as the TFT of Example 1, the thin film transistor when the UV irradiation time is 10 min is referred to as the TFT of Example 2, and the thin film transistor when the UV irradiation time is 20 min is referred to as the TFT of Example 3. Moreover, irrespective of the heat treatment temperature, the thin film transistor when the UV irradiation time is 30 min is referred to as the TFT of Example 4, the thin film transistor when the UV irradiation time is 60 min is referred to as the TFT of Example 5, and the thin film transistor when the UV irradiation time is 90 min is referred to as the TFT of Example 6.

Figure 22:
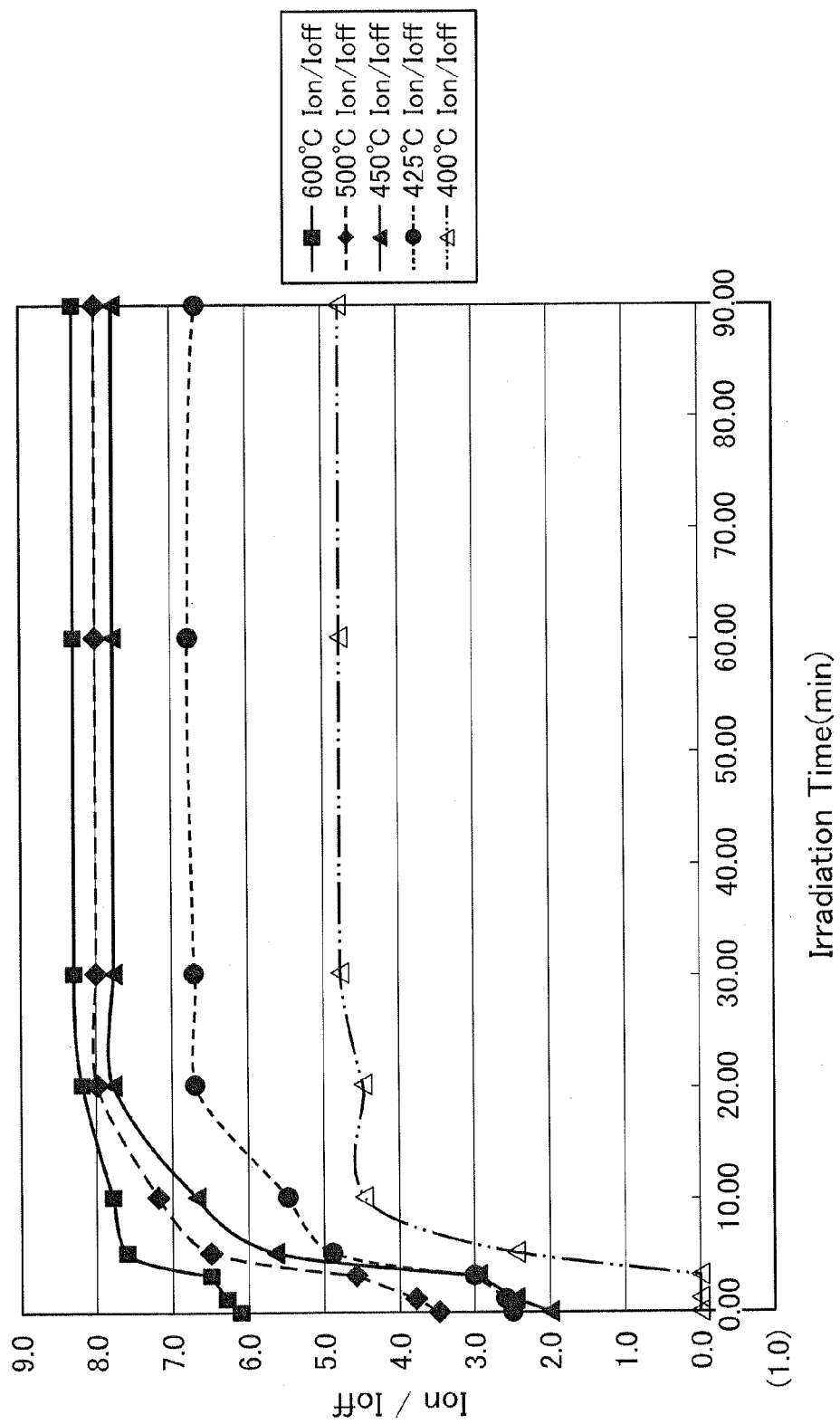
FIG. 22 is a diagram showing the relationship between the on-off ratio and the UV irradiation time, which is determined from the Vg-Id characteristics shown in FIG. 17 to FIG. 21.
Figure 23:
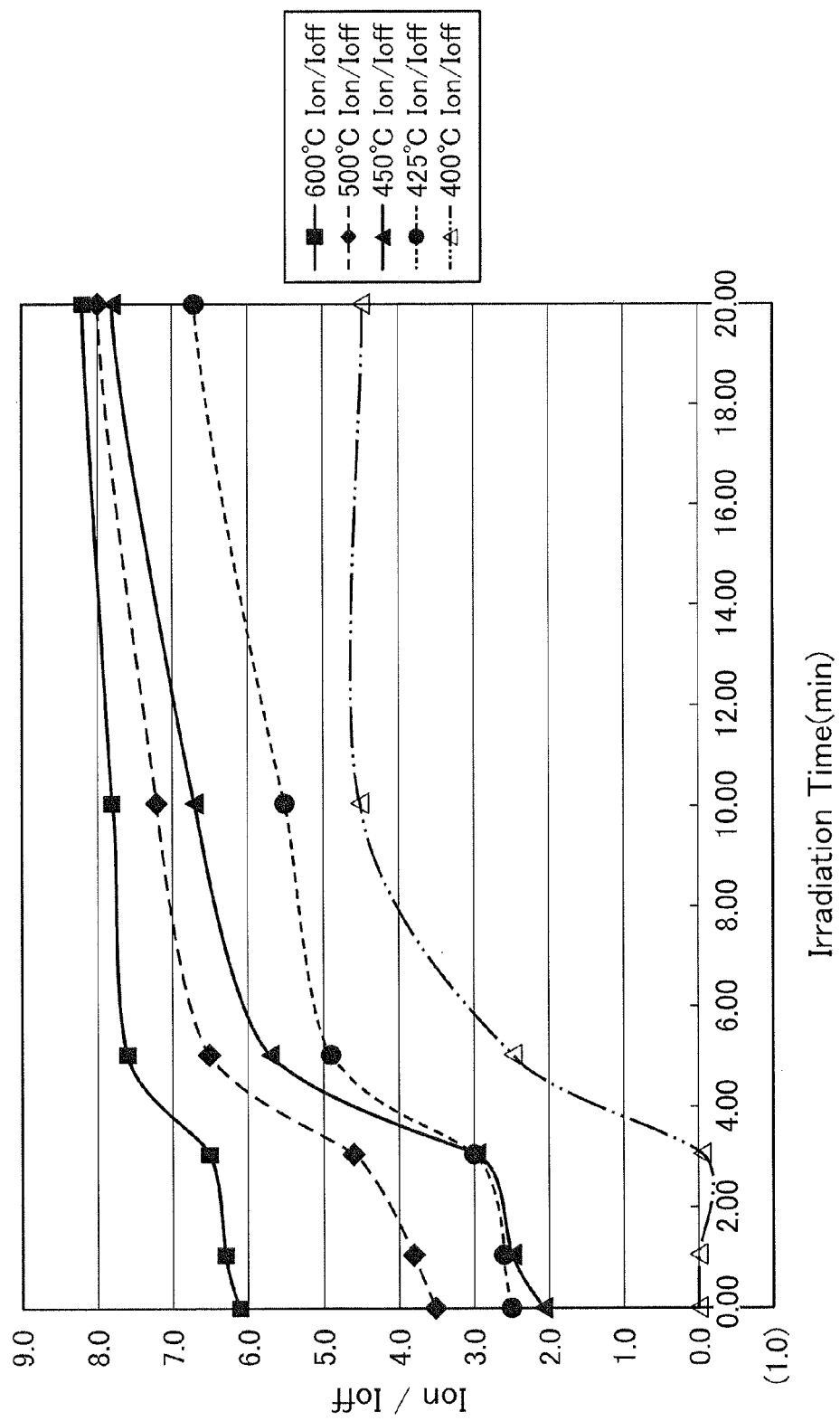
FIG. 23 is a partially enlarged diagram of a part of FIG. 22.
Figure 24:
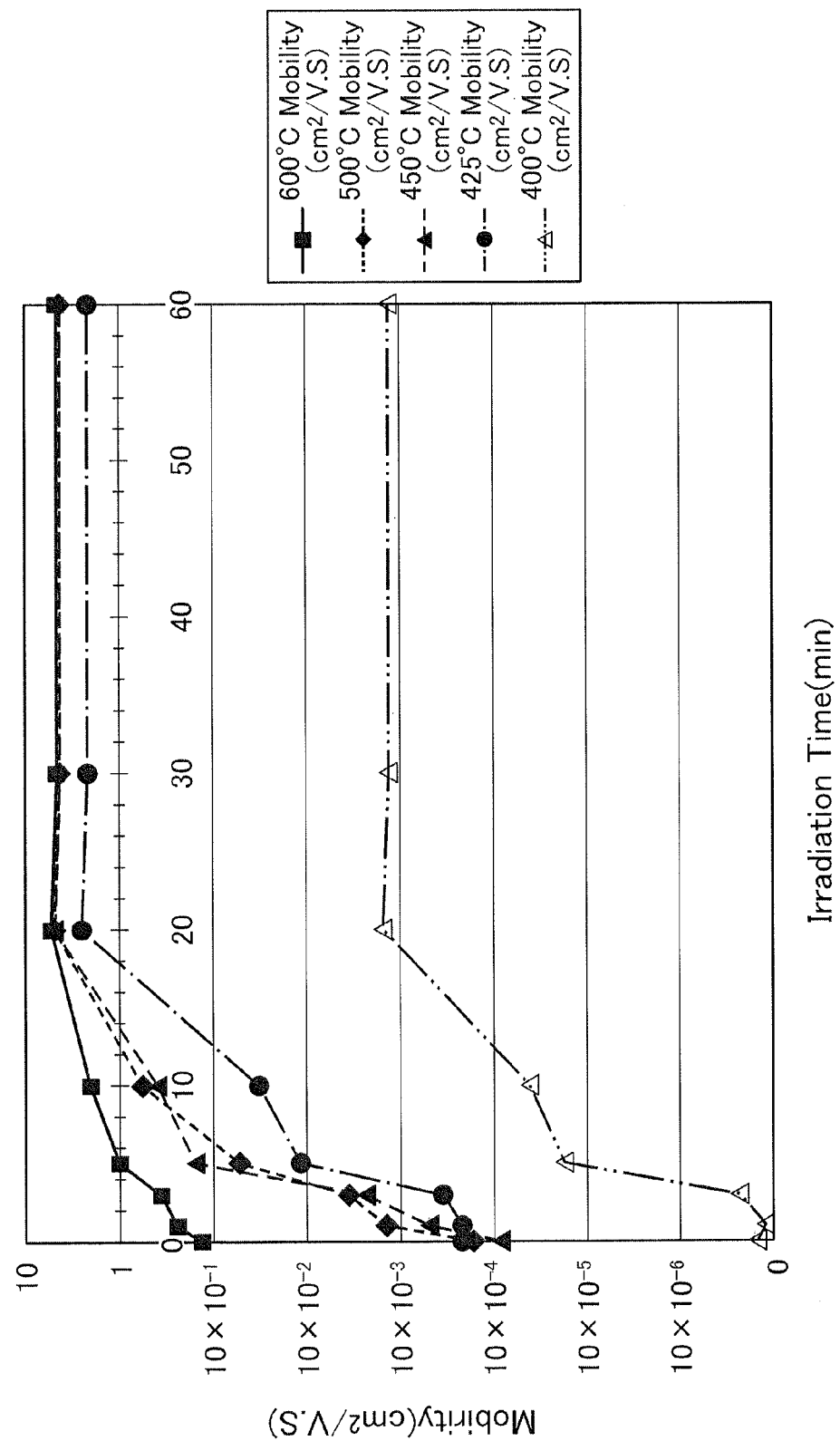
FIG. 24 is a diagram showing the relationship between the mobility and the UV irradiation time, which is determined from the Vg-Id characteristics shown in FIG. 17 to FIG. 21.

The relationship between the on-off ratio and the UV irradiation time, which is determined from the Vg-Id characteristics shown in FIG. 17 to FIG. 21, is summarized in Table 2, and the relationship between the mobility and the UV irradiation time, which is determined from the Vg-Id characteristics shown in FIG. 17 to FIG. 21, is summarized in Table 3. Further, the relationship between the on-off ratio and the UV irradiation time, which is determined from the Vg-Id characteristics shown in FIG. 17 to FIG. 21, is shown in FIG. 22, and a partially enlarged diagram of a part of FIG. 22 is shown in FIG. 23. Moreover, the relationship between the mobility and the UV irradiation time, which is determined from the Vg-Id characteristics shown in FIG. 17 to FIG. 21, is shown in FIG. 24.

TABLE 2

| | Irradiation Time | On-Off Ratio: Log (Ion/Ioff) | | | | |
|---|---|---|---|---|---|---|
| | (min) | 600° C. | 500° C. | 450° C. | 425° C. | 400° C. |
| Comparative Example 1 | 0.00 | 6.1 | 3.5 | 2.1 | 2.5 | 0.0 |
| Comparative Example 2 | 1.00 | 6.3 | 3.8 | 2.5 | 2.6 | 0.0 |
| Comparative Example 3 | 3.00 | 6.5 | 4.6 | 3.0 | 3.0 | 0.0 |
| Example 1 | 5.00 | 7.6 | 6.5 | 5.7 | 4.9 | 2.5 |
| Example 2 | 10.00 | 7.8 | 7.2 | 6.7 | 5.5 | 4.5 |
| Example 3 | 20.00 | 8.2 | 8.0 | 7.8 | 6.7 | 4.5 |

TABLE 2-continued

| | Irradiation Time | On-Off Ratio: Log (Ion/Ioff) | | | | |
|---|---|---|---|---|---|---|
| | (min) | 600° C. | 500° C. | 450° C. | 425° C. | 400° C. |
| Example 4 | 30.00 | 8.3 | 8.0 | 7.8 | 6.7 | 4.8 |
| Example 5 | 60.00 | 8.3 | 8.0 | 7.8 | 6.8 | 4.8 |
| Example 6 | 90.00 | 8.3 | 8.0 | 7.8 | 6.7 | 4.8 |

TABLE 3

| | Irradiation Time (min) | Mobility ($cm^2/V \cdot S$) | | | | |
|---|---|---|---|---|---|---|
| | | 600° C. | 500° C. | 450° C. | 425° C. | 400° C. |
| Comparative Example 1 | 0 | $1.4 \times 10^{-1}$ | $1.7 \times 10^{-4}$ | $9.8 \times 10^{-5}$ | $2.3 \times 10^{-4}$ | $1.5 \times 10^{-7}$ |
| Comparative Example 2 | 1 | $2.5 \times 10^{-1}$ | $1.5 \times 10^{-3}$ | $5.5 \times 10^{-4}$ | $2.3 \times 10^{-4}$ | $1.4 \times 10^{-7}$ |
| Comparative Example 3 | 3 | $3.8 \times 10^{-1}$ | $3.8 \times 10^{-3}$ | $2.6 \times 10^{-3}$ | $3.7 \times 10^{-4}$ | $2.4 \times 10^{-7}$ |
| Example 1 | 5 | $9.8 \times 10^{-1}$ | $5.5 \times 10^{-2}$ | $1.7 \times 10^{-1}$ | $1.2 \times 10^{-2}$ | $1.8 \times 10^{-5}$ |
| Example 2 | 10 | 2.1 | $6.0 \times 10^{-1}$ | $4.2 \times 10^{-1}$ | $3.4 \times 10^{-2}$ | $4.23 \times 10^{-5}$ |
| Example 3 | 20 | 5.5 | 5.0 | 4.8 | 2.6 | $1.6 \times 10^{-3}$ |
| Example 4 | 30 | 4.9 | 5.1 | 4.4 | 2.2 | $1.4 \times 10^{-3}$ |
| Example 5 | 60 | 5.1 | 5.2 | 4.6 | 2.3 | $1.4 \times 10^{-3}$ |
| Example 6 | 90 | 5.3 | 5.1 | 4.4 | 2.4 | $1.5 \times 10^{-3}$ |

From the Vg-Id characteristics shown in FIG. 17 to FIG. 21, it is understood that favorable Vg-Id characteristics are obtained, as the UV ozone treatment time is longer.

Particularly, as shown in FIG. 22 and FIG. 23, it is understood that, in the TFTs of Examples 1 to 6 in which the irradiation time is 5 minutes or more, the on-off ratio rapidly increases, compared to the TFTs of Comparative Examples 1 to 3, resulting in improvement in membrane properties.

Further, as shown in Table 3 and FIG. 24, it is understood that, in the TFTs of Examples 2 to 6 in which the irradiation time is 10 minutes or more, the on-off ratio rapidly increases, compared to the TFT of Example 1, resulting in improvement in membrane properties. That is, it is understood that, in an infrared absorption spectrum obtained when the second oxide precursor film (active layer) is analyzed by Fourier transform infrared spectroscopy, when the infrared wave number range (II) of from 1380 $cm^{-1}$ to 1520 $cm^{-1}$ is divided into an infrared wave number range (IV) of from 1380 $cm^{-1}$ to 1450 $cm^{-1}$ and an infrared wave number range (III) of from more than 1450 $cm^{-1}$ to 1520 $cm^{-1}$, from the moment at which the peak positioned within the infrared wave number range (IV) of from 1380 $cm^{-1}$ to 1450 $cm^{-1}$ begins to attain the maximum value in the infrared absorption spectrum within an infrared wave number range (I) of from 1350 $cm^{-1}$ to 1750 $cm^{-1}$ (corresponding to: irradiation time of 5 minutes or more, total amount of energy of 1.5 $J/cm^2$ or greater, and a rate of lowering of peak of 0.37 or less), the on-off ratio rapidly increases, compared to the case in which the UV irradiation time is less than 5 minutes.

Further, as shown in Table 3, it is understood that, in the TFTs of Examples 1 to 6 in which the irradiation time is 5 minutes or more, the mobility becomes higher compared to the TFTs of Comparative Examples 1 to 3, resulting in improvement in membrane properties. That is, it is understood that, from the moment at which the peak positioned within the infrared wave number range (II) of from 1380 $cm^{-1}$ to 1520 $cm^{-1}$ begins to attain the maximum value in the infrared absorption spectrum within an infrared wave number range (I) of from 1350 $cm^{-1}$ to 1750 $cm^{-1}$ (corresponding to: irradiation time of 5 minutes or more, total amount of energy of 1.5 $J/cm^2$ or greater, and a rate of lowering of peak of 0.37 or less), the number of digits of the value of mobility increases by about one or more, as compared to the case in which the UV irradiation time is less than 5 minutes.

Furthermore, as shown in FIG. 22, it is understood that, in the TFTs of Examples 3 to 6 in which the irradiation time is 20 minutes or more, the on-off ratio is higher compared to the TFTs of Example 1 and Example 2, and moreover, the on-off ratio is stabilized (saturated). Further, as shown in FIG. 24, it is understood that, in the TFTs of Examples 3 to 6 in which the irradiation time is 20 minutes or more, the on-off ratio rapidly increases compared to the TFTs of Example 1 and Example 2, and the mobility is stabilized (saturated) among the TFTs of Examples 3 to 6. That is, in the pre-treatment process, when a photo treatment is performed using a total amount of energy of 4 times (in the Example, 6.0 $J/cm^2$) or more, with respect to a total amount of energy (in the Example, 1.5 $J/cm^2$) of a photo treatment necessary when the peak positioned within the infrared wave number range (II) of from 1380 $cm^{-1}$ to 1520 $cm^{-1}$, in the infrared absorption spectrum obtained when the second oxide precursor film (active layer) is analyzed by Fourier transform infrared spectroscopy, begins to attain the maximum value in the infrared absorption spectrum within the infrared wave number range (I) of from 1350 $cm^{-1}$ to 1750 $cm^{-1}$, along with the treatment time (irradiation time) of the UV ozone treatment, the on-off ratio is higher, the on-off ratio is stabilized (saturated), and the mobility rapidly increases, compared to the case of using a total amount of energy of less than 4 times.

Furthermore, as shown in FIG. 24, it is understood that, in the TFTs of Examples 3 and 4 in which the irradiation time is from 20 minutes to 30 minutes, the mobility becomes higher, compared to the TFTs of Example 1, Example 2, Example 5, and Example 6. That is, in the pre-treatment process, when a photo treatment is performed using a total amount of energy of from 4 times to 6 times (in the Example, 9.0 $J/cm^2$), with respect to the total amount of energy (in the Example, 1.5 $J/cm^2$) of a photo treatment necessary when the peak positioned within the infrared wave number range (II) of from 1380 $cm^{-1}$ to 1520 $cm^{-1}$, in the infrared absorption spectrum obtained when the second oxide precursor film (active layer) is analyzed by Fourier transform infrared spectroscopy, begins to attain the maximum value in the infrared absorption spectrum within the infrared wave number range (I) of from 1350 $cm^{-1}$ to 1750 $cm^{-1}$, along with the treatment time (irradiation time) of the UV ozone treatment, the mobility becomes higher compared to the case of using a total amount of energy of less than 4 times, or more than 6 times.

When a total amount of energy of more than 6 times is used, although the mobility is stabilized (saturated), this results in performing a lengthy UV ozone treatment with respect to the second oxide precursor film (active layer). By performing UV ozone treatment using a total amount of energy of from 4 times to 6 times, it is thought that a lengthy UV ozone treatment (irradiation of UV) can be avoided, and deterioration of electric conductivity of the active layer caused by oxidization of the metal in the solution can be suppressed. Further, it is thought that, in a case in which the substrate is a resin substrate or a substrate formed from a composite material of a resin as described above, deformation of the substrate due to UV ozone treatment can be suppressed.

Figure 25:
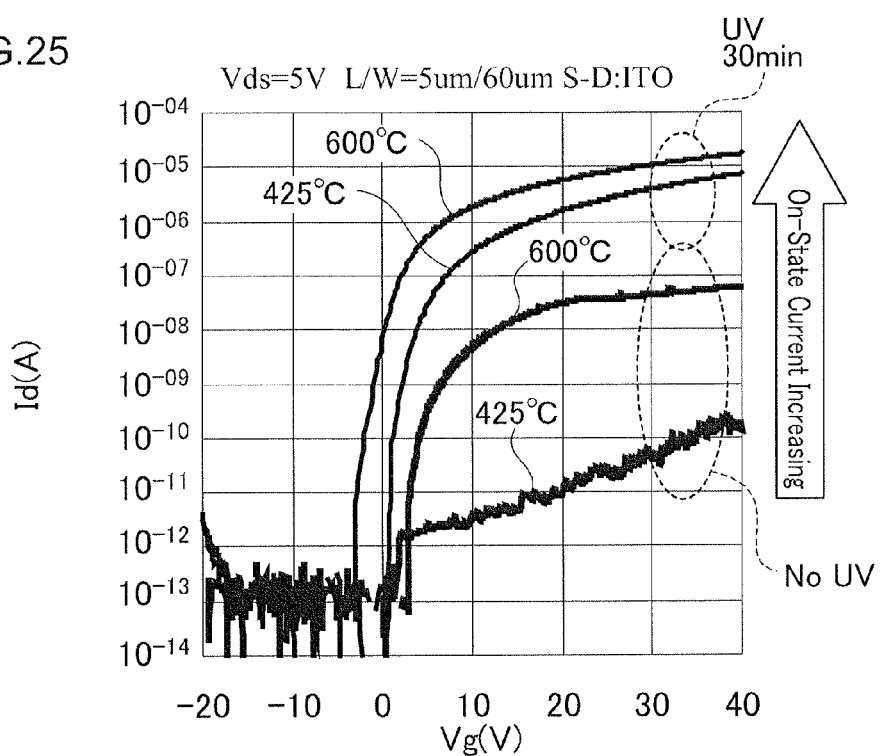
FIG. 25 is a diagram showing the Vg-Id characteristics of the TFT of Example 4 and the TFT of Comparative Example 1.

Next, with regard to the TFT of Example 4 in which UV ozone treatment with an irradiation time of 30 minutes was performed and favorable properties were obtained, the comparison of mobility between the presence and absence of UV ozone treatment was examined FIG. 25 is a diagram showing the Vg-Id characteristics of the TFT of Example 4 and the TFT of Comparative Example 1. In FIG. 25, only the data when the heat treatment temperature was 425° C. or 600° C. are shown.

Figure 26:
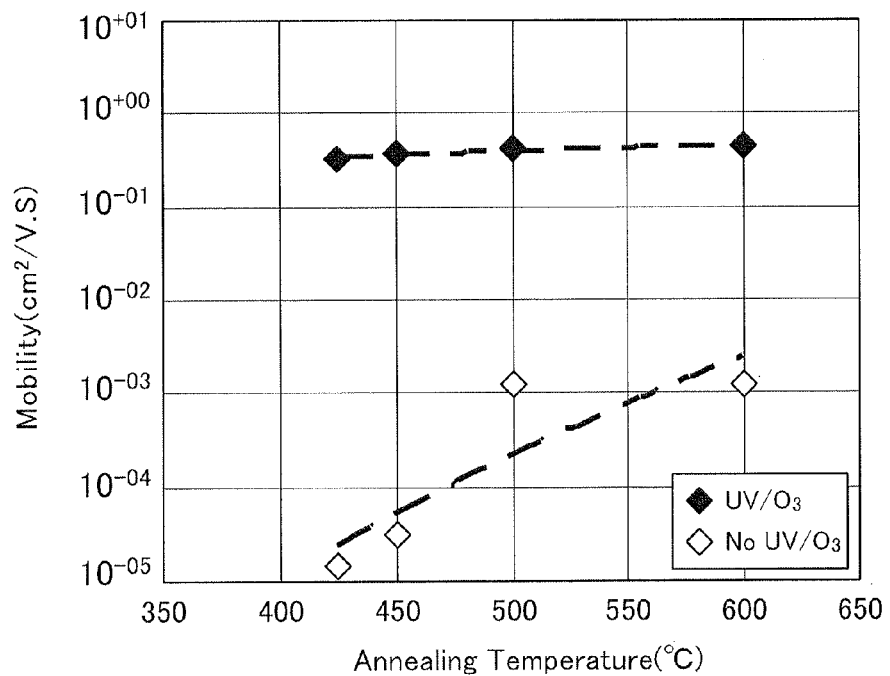
FIG. 26 is a graph obtained by plotting the relationship between the heat treatment temperature (excluding 400° C.) and the mobility, of the TFT of Example 4 and the TFT of Comparative Example 1.

FIG. 26 is a graph obtained by plotting the relationship between the heat treatment temperature (excluding 400° C.) and the mobility for the TFT of Example 4 and the TFT of Comparative Example 1.

From the results shown in FIG. 25, it is confirmed that, due to the presence or absence of the UV ozone treatment, for example, the on-state current changes dramatically, and that, in the TFT of Comparative Example 1 in which the UV ozone treatment has not been performed, improvement in properties cannot be expected, and TFT properties such as on-state current or the like are deteriorated, as the heat treatment temperature is lowered.

Further, as shown in FIG. 26, in the TFT of Example 4 in which the UV ozone treatment has been performed, the number of digits of the value of mobility increases by about one or more compared to the TFT of Comparative Example 1, and by performing heat treatment at a temperature of from 425° C. to 600° C., the mobility thereof exhibits a value of almost the same level.

—XPS Evaluation—

Next, in order to examine the relationship imparted by the UV ozone treatment as the pre-treatment on the physical properties after heat treatment, measurement of XPS was carried out. For this XPS measurement, an AXIS-ULTRA manufactured by Shimadzu Corporation was used. As the measurement samples, samples obtained by subjecting the above IGZO solution to UV ozone treatment for 30 minutes, and then performing heat treatment at a temperature of 425° C., 450° C., and 500° C., respectively, were used. As the measurement samples for comparison, samples obtained by subjecting the above IGZO solution, as is, to heat treatment at a temperature of 425° C., 450° C., and 500° C., respectively, were used. In addition, as the measurement sample for comparison, a sputtered film having the same IGZO composition as the composition of the IGZO solution was used.

Figure 27:
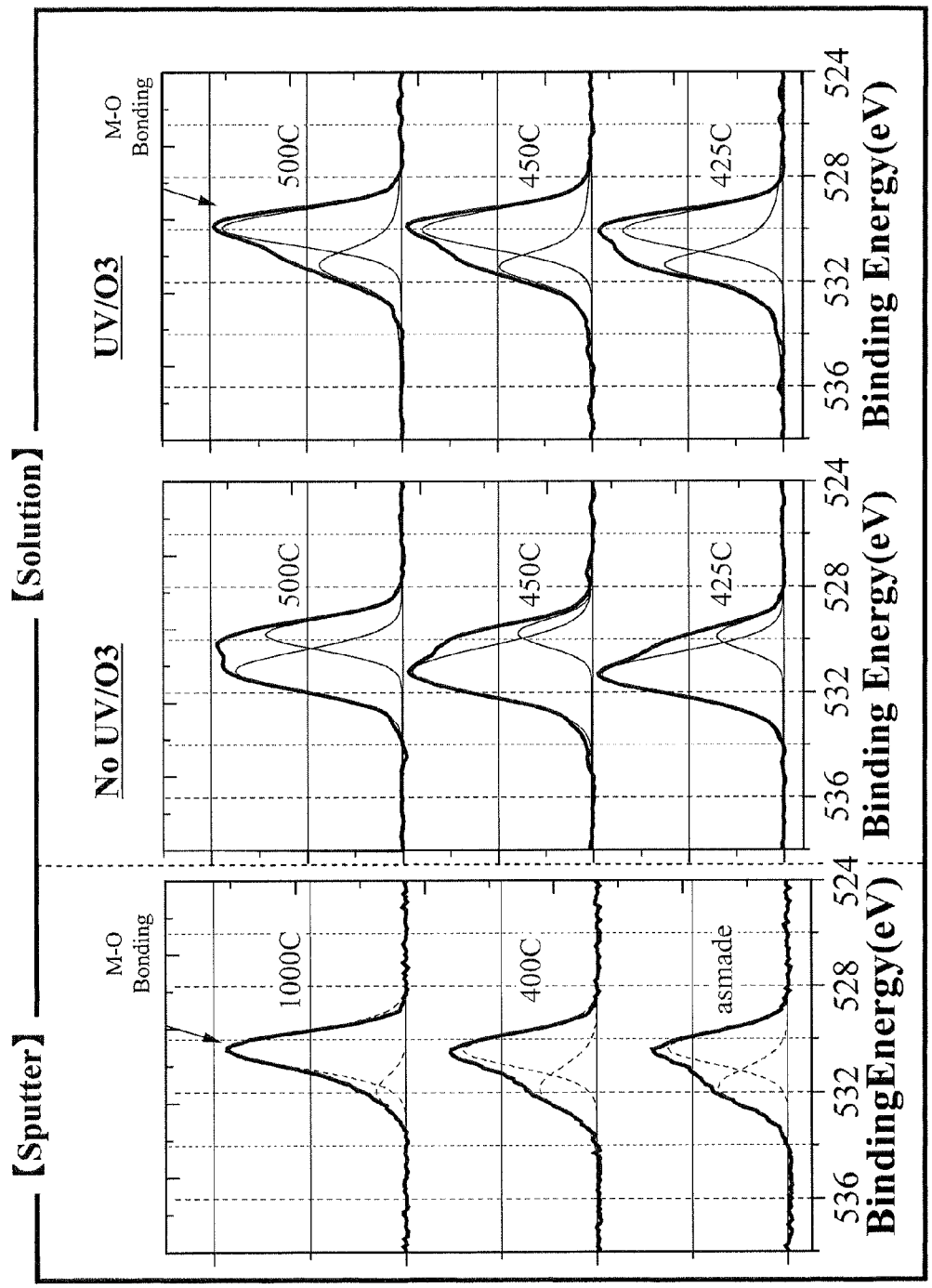
FIG. 27 is a diagram showing the XPS data of the respective measurement samples.

FIG. 27 is a diagram showing the XPS data of the respective measurement samples.

From the results shown in FIG. 27, it is understood that the binding state of oxygen in the samples that have been subjected to UV ozone treatment for 30 minutes becomes closer to that in the sputtered film. This means that the binding state of M-O (M: one of In, Ga, and Zn) is getting stronger, and it is thought that this strong binding state causes improvement in mobility. In a liquid phase process, since a large amount of C, H, and the like, which are not included in a vacuum process, are included, generally, the formation of M-O bonding is likely to be inhibited. Particularly, in a vacuum process, it is difficult for Ga, Al, Ta, Ti, W or the like, which has a function of reducing the carrier concentration, to perform introduction or release of oxygen that is a generation source of a carrier, and therefore, once a bond such as M-OH is formed, it is difficult to change the binding state again to form an M-O bond. Accordingly, generally in a liquid phase process, there is a tendency toward reducing the addition amount of Ga as much as possible; however, in the exemplary embodiment of the invention, by performing the pre-treatment process such as UV ozone treatment or the like to reform the precursor film, it becomes possible to enhance the formation of M-O bonding, without going through a bond such as M-OH or the like to the greatest extent possible.

Further, from the results shown in FIG. 27, it is understood that, in each of the samples (amorphous oxide thin films) that have been subjected to UV ozone treatment for 30 minutes, the position of binding energy that attains maximum spectrum intensity in the binding energy of oxygen (O1s) by XPS exists at the same position (near 530 eV) as the position in the sample (amorphous oxide thin film) prepared by a vacuum process using the same metal composition.

<Example of Organic Acid Salt System>

—Preparation and Examination of First Oxide Precursor Film and Second Oxide Precursor Film—

In the above Example, various samples were prepared using a metal alkoxide-based IGZO solution; however, in the following Example, various samples were prepared using an organic acid salt-based IGZO solution.

A zinc acetate-methoxyethanol solution, a gallium acetylacetonato-propionic acid solution, and an indium acetylacetonato-propionic acid solution, all of which had been adjusted to 0.2 mol/kg, were prepared, and were mixed to be In:Ga:Zn=1:1:1, thereby obtaining an organic acid salt-based raw material liquid (IGZO solution).

Subsequently, on a quartz substrate, the above IGZO solution was spin-coated once at a speed of 1000 rpm, and was dried at room temperature, thereby forming a first oxide precursor film in a gel state. Then, evaluation of the first oxide precursor film thus obtained was performed by XRD, and almost the same results as the results shown in FIG. 10 were obtained.

Next, with respect to plural first oxide precursor films that had only been dried at room temperature, UV ozone treatment was performed as the pre-treatment process, by varying the irradiation time as 1 minute, 3 minutes, 5 minutes, 10 minutes, 30 minutes, 60 minutes, and 90 minutes, respectively, thereby obtaining second oxide precursor films. In this UV ozone treatment, a low pressure mercury lamp (wavelength 185 nm and 254 nm) was used, in which the intensity of light at 254 nm was about 5 mW/cm$^2$.

Further, with respect to the second oxide precursor films after the UV ozone treatment, measurement of FT-IR spectrum was carried out using a measurement apparatus, apparatus name: BRUKER ALPHA, and using a diamond ATR configuration. Further, for comparison, measurement of FT-IR spectrum on the first oxide precursor film, as is, which had not been subjected to UV ozone treatment, was also carried out.

Figure 28:
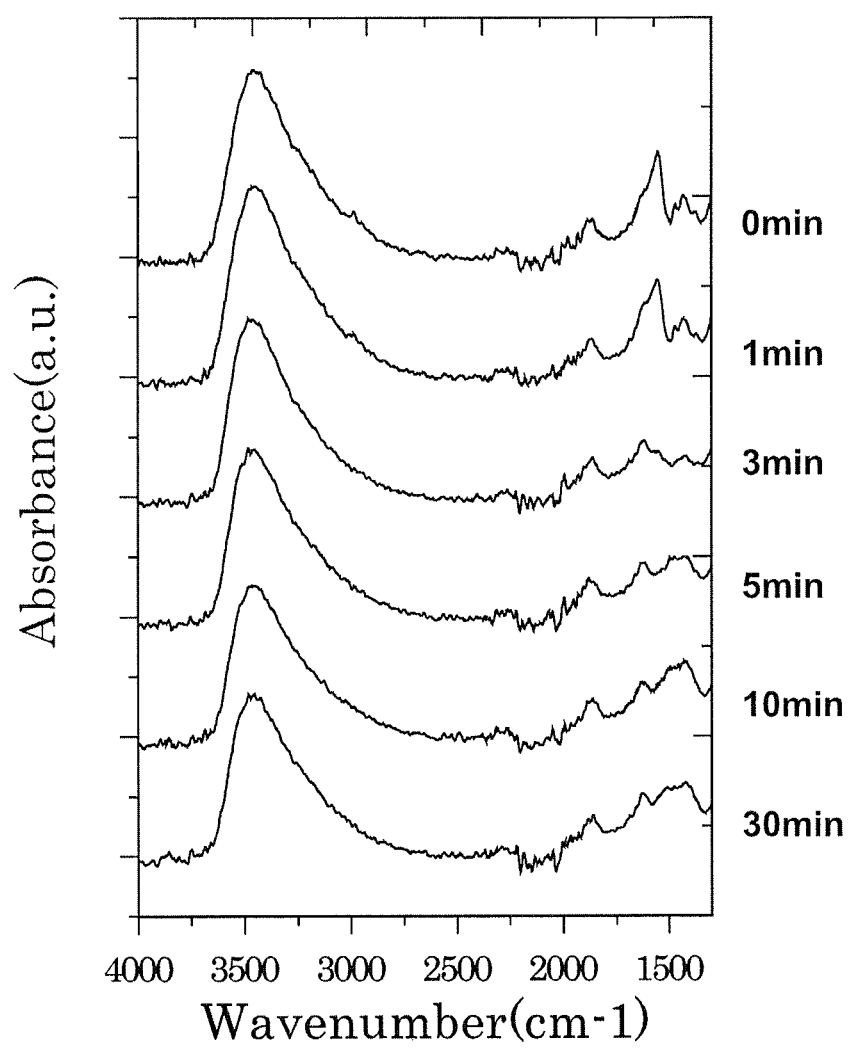
FIG. 28 is a diagram showing the results of measurement of FT-IR spectrum with respect to the respective second oxide precursor films.
Figure 29:
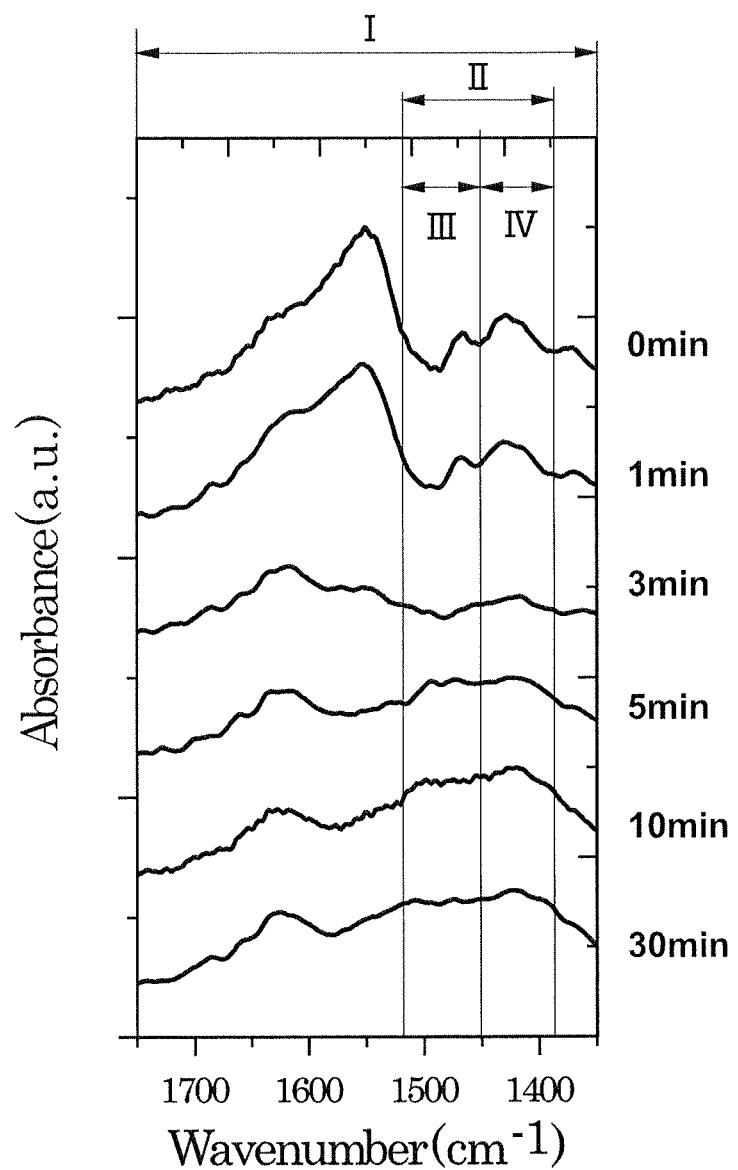
FIG. 29 is an enlarged view of the infrared absorption spectrum in an infrared wave number range of from 1350 $cm^{-1}$ to 1750 $cm^{-1}$ shown in FIG. 28.

FIG. 28 is a diagram showing the results of measurement of FT-IR spectrum, with respect to the respective second oxide precursor films. FIG. 29 is an enlarged view of the infrared absorption spectrum in an infrared wave number range of from 1350 cm$^{-1}$ to 1750 cm$^{-1}$ shown in FIG. 28.

As shown in FIG. 28, it is confirmed that the shape of the peak positioned within the range of from 1350 cm$^{-1}$ to 1750 cm$^{-1}$ is selectively changed with the amount of time of UV treatment.

Further, as shown in FIG. 29, when the irradiation time of the UV ozone treatment is less than 5 minutes, a peak positioned within the infrared wave number range of from 1500 cm$^{-1}$ to 1600 cm$^{-1}$ attains the maximum value in the infrared absorption spectrum within the infrared wave number range (I) of from 1350 cm$^{-1}$ to 1750 cm$^{-1}$. In contrast, it is understood that, when the irradiation time of the UV ozone treatment is equal to or more than 5 minutes, in an infrared absorption spectrum obtained when the second oxide precursor film is analyzed by Fourier transform infrared spectroscopy, a (double) peak positioned within the infrared wave number range (II) of from 1380 cm$^{-1}$ to 1520 cm$^{-1}$ attains the maximum value in the infrared absorption spectrum within the infrared wave number range (I) of from 1350 cm$^{-1}$ to 1750 cm$^{-1}$.

Specifically, it is also understood that, when the irradiation time of the UV ozone treatment is equal to or more than 5 minutes, in an infrared absorption spectrum obtained when the second oxide precursor film is analyzed by Fourier transform infrared spectroscopy, when the infrared wave number range (II) of from 1380 cm$^{-1}$ to 1520 cm$^{-1}$ is divided into an infrared wave number range (IV) of from 1380 cm$^{-1}$ to 1450 cm$^{-1}$ and an infrared wave number range (III) of from more than 1450 cm$^{-1}$ to 1520 cm$^{-1}$, a peak positioned within the infrared wave number range (IV) of from 1380 cm$^{-1}$ to 1450 cm$^{-1}$ attains the maximum value in the infrared absorption spectrum within the infrared wave number range (I) of from 1350 cm$^{-1}$ to 1750 cm$^{-1}$.

Note that, in the infrared wave number range (IV) of from 1380 cm$^{-1}$ to 1450 cm$^{-1}$ and the infrared wave number range (III) of from more than 1450 cm$^{-1}$ to 1520 cm$^{-1}$, a double peak such that the peak straddles the two ranges is seen, and one peak of this double peak is a peak positioned within the above range (IV).

—Production of Thin Film Transistor—

Next, a bottom gate-top contact type thin film transistor was produced, in order to evaluate how the state of the second oxide precursor film, which varies depending on the irradiation time of the UV ozone treatment, influences the thin film after heat treatment in terms of device properties.

Figure 30:
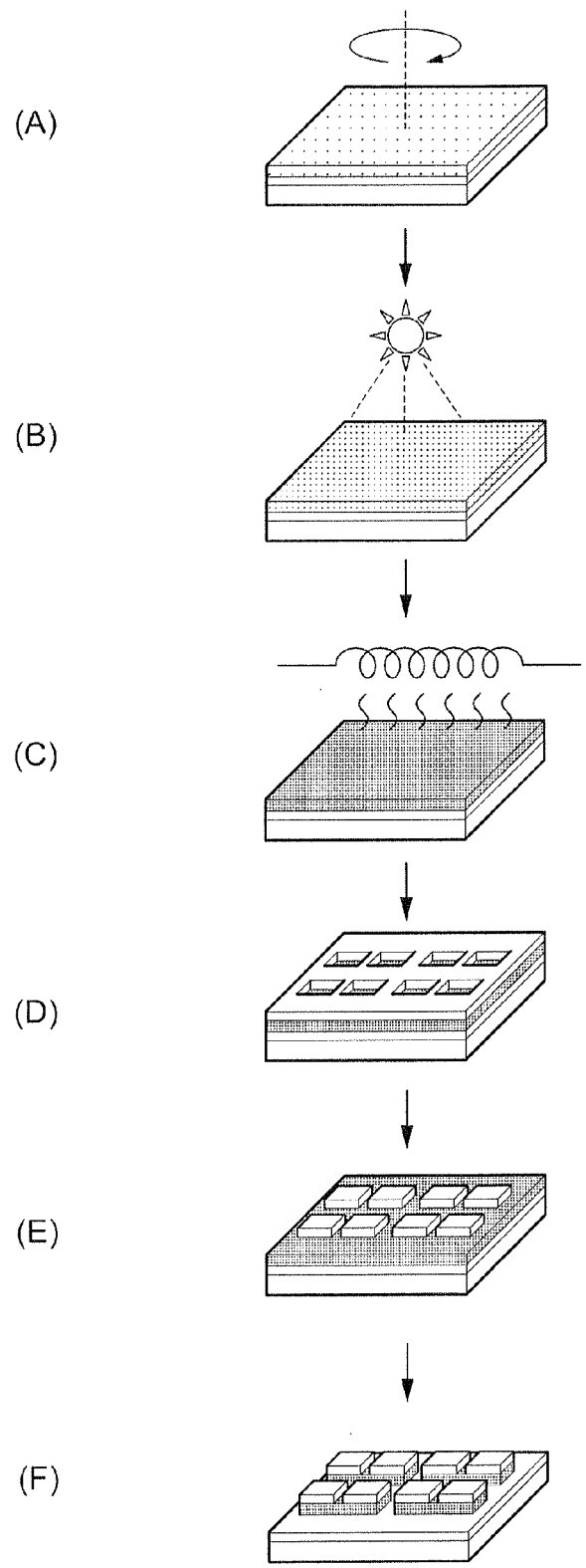
FIG. 30 is a process chart showing a method for producing a thin film transistor according to an exemplary embodiment of the present invention.

FIG. 30 is a process chart showing a method for producing a thin film transistor according to an Example of the invention.

For the substrate of the thin film transistor according to the Example of the invention, a P+Si/Si thermal oxide film (100 nm)-attached substrate was used, P+Si was used as the gate electrode, and an Si thermal oxide film was used as the gate insulating layer.

Next, in the processes shown in FIGS. 30 (A) to (C), an active layer was prepared by the same method as in the above-described method for obtaining a second oxide precursor film from a first oxide precursor film. Specifically, as shown in FIG. 30 (A), using an IGZO solution (the same solution as the metal alkoxide based IGZO solution described above; In:Ga:Zn=1.0:1.0:0.9), formation of the active layer was carried out by a spin coating method, such that the film thickness of the final product was about 50 nm (this is because the amount of the organic component decreases due to the heat treatment, whereby the film thickness varies). After the film formation, as shown in FIG. 30 (B), UV ozone treatment was carried out for 5 minutes as the pre-treatment, and thereafter, as shown in FIG. 30 (C), heat treatment was carried out at a temperature within the range of from 375° C. to 600° C. for 15 minutes, as the post-treatment. Then, as shown in FIG. 30 (D), a lift-off pattern was formed by using photolithography. For the resist, AZ5214E was used. Thereafter, an electrode of Mo with a thickness of 100 nm was formed, and the resist was peeled off, to form an SD electrode pattern as shown in FIG. 30 (E). For the patterning of the active layer, TSMR 8900-LB was used as a resist, and patterning was performed using dry etching by Ar plasma. Peeling of the resist was conducted by oxygen etching, to produce a thin film transistor as shown in FIG. 30 (F).

Next, the thin film transistor thus obtained was subjected to measurement of transistor properties (Vg-Id characteristics) and mobility μ, using a semiconductor parameter analyzer 4156 C (manufactured by Agilent Technologies Inc.). The Vg-Id characteristics were measured by changing the gate voltage (Vg) within a range of from −20 V to +40V at a fixed drain voltage (Vd) of 5 V, and measuring the drain current (Id) at each gate voltage (Vg).

—Evaluation of Transistor Properties and Mobility—

Next, the thin film transistor thus obtained was subjected to measurement of transistor properties (Vg-Id characteristics) and mobility μ, using a semiconductor parameter analyzer 4156 C (manufactured by Agilent Technologies Inc.). The Vg-Id characteristics were measured by changing the gate voltage (Vg) within a range of from −20 V to +40V at a fixed drain voltage (Vd) of 5 V, and measuring the drain current (Id) at each gate voltage (Vg). Further, for comparison, with respect to a thin film transistor prepared by omitting the UV ozone treatment shown in FIG. 30 (B), measurement of transistor properties (Vg-Id characteristics) and mobility μ was carried out.

Figure 31:
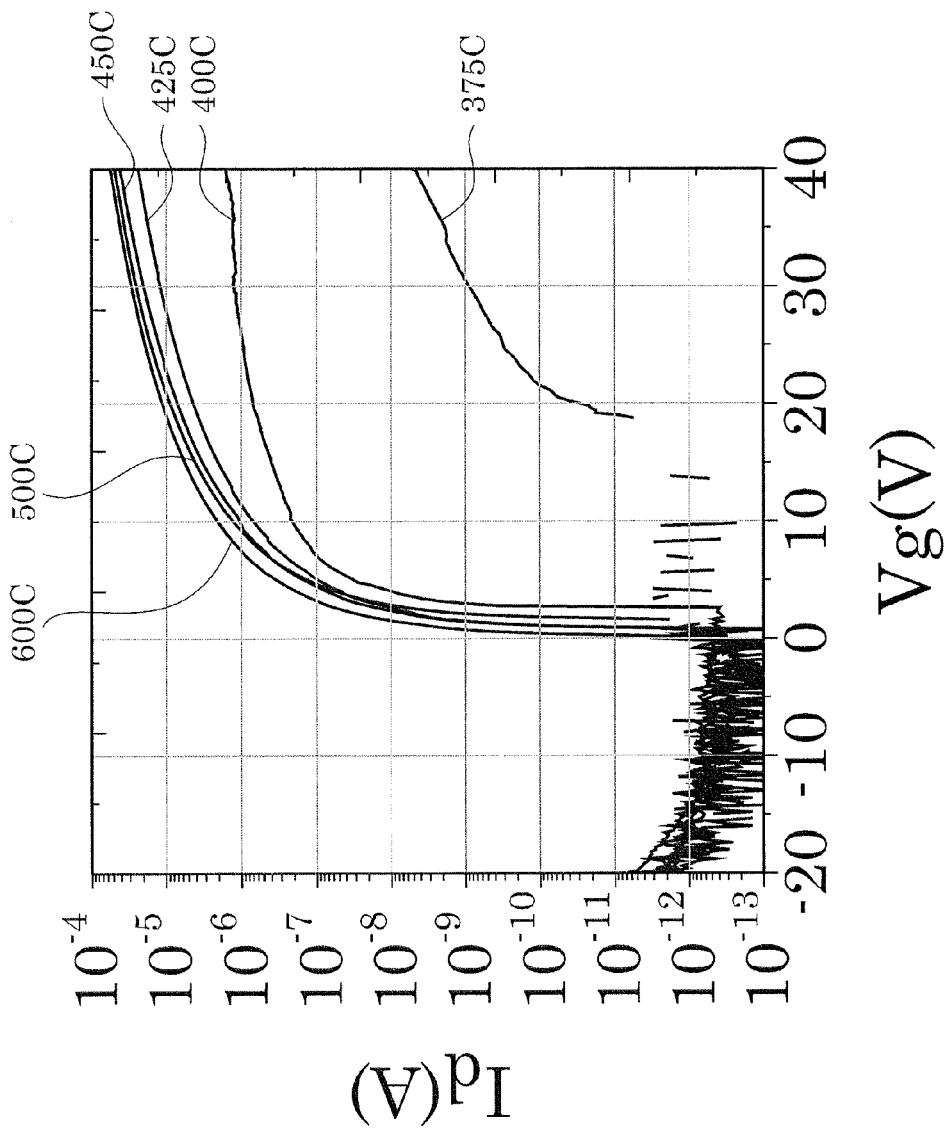
FIG. 31 is a diagram showing the Vg-Id characteristics of a thin film transistor obtained in the Examples.
Figure 32:
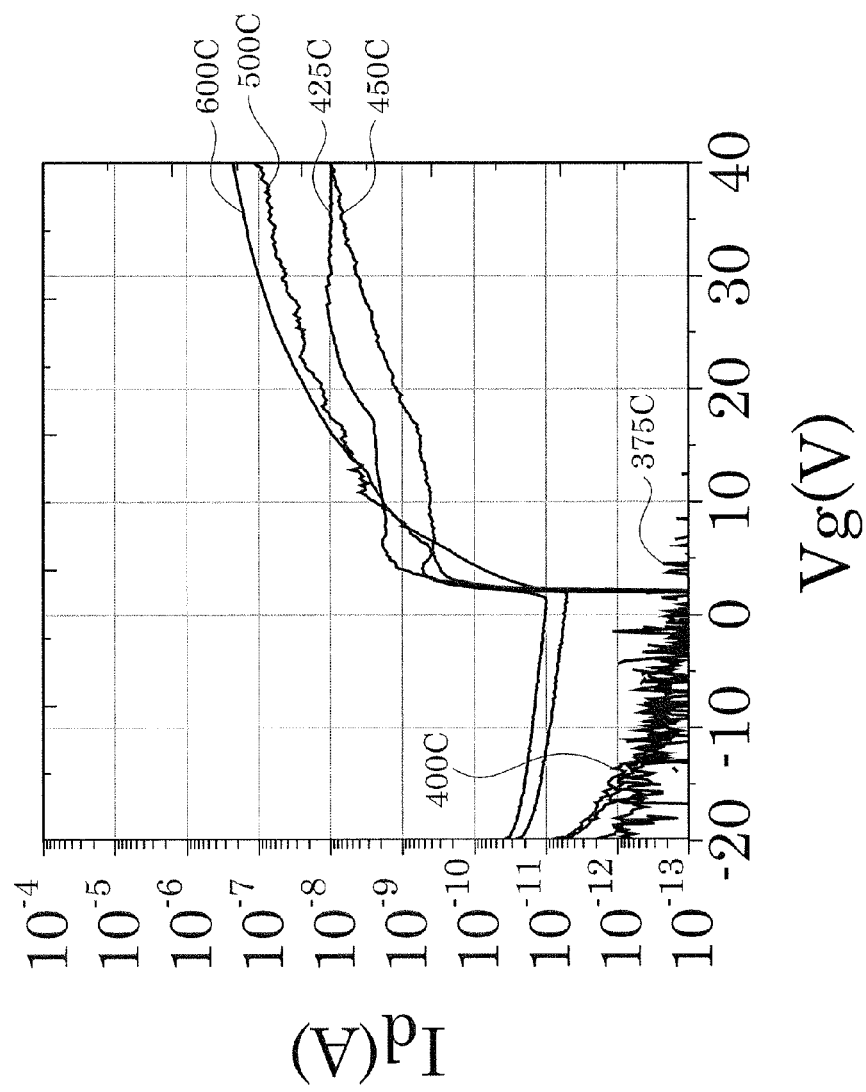
FIG. 32 is a diagram showing the Vg-Id characteristics of a thin film transistor prepared by omitting UV ozone treatment.
Figure 33:
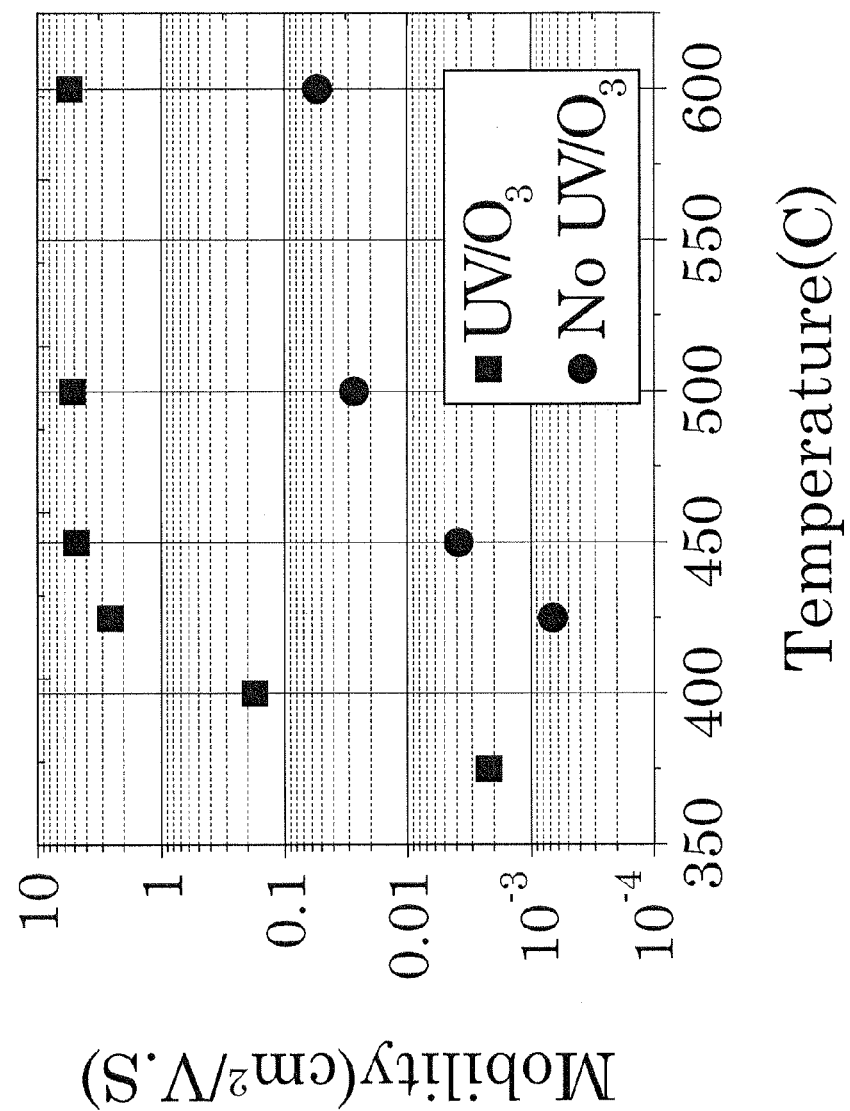
FIG. 33 is a graph obtained by plotting the relationship between the heat treatment temperature and the mobility of a thin film transistor.

FIG. 31 is a diagram showing the Vg-Id characteristics of the thin film transistor obtained in the Example. Further, FIG. 32 is a diagram showing the Vg-Id characteristics of the thin film transistor prepared by omitting the UV ozone treatment. Moreover, FIG. 33 is a graph obtained by plotting the relationship between the heat treatment temperature and the mobility of the thin film transistor.

Comparing FIG. 31 and FIG. 32, similar to the results shown in FIG. 25, it is understood that, due to the presence or absence of the UV ozone treatment, for example, the on-state current is changed dramatically. Further, comparing the results of mobility shown in FIG. 33 and the results of mobility shown in FIG. 26, it is understood that the number of digits of the value of mobility shown in FIG. 33 is increased by about one. It is thought that this is not because the solution is different, but rather, this depends on whether patterning of the active layer is performed before the formation of the electrode, or patterning of the active layer is performed after the formation of the electrode, and it is assumed that the active layer is less likely to be damaged in the case of patterning the active layer after the formation of the electrode, and as a result, the mobility becomes higher.

—Identification of Peak—

Next, concerning the peak positioned within the infrared wave number range (II) of from 1380 cm$^{-1}$ to 1520 cm$^{-1}$, shown in FIG. 11 and FIG. 12, and in FIG. 28 and FIG. 29, the derivation (origin) of the double peak which is seen when the treatment time of the UV ozone treatment is 5 minutes or more was examined.

First, a zinc acetylacetonato-methanol solution, a gallium acetylacetonato-propionic acid solution, and an indium acetylacetonato-propionic acid solution, all of which had been adjusted to 0.2 mol/kg, were prepared. Then, the solutions were each spin-coated once on a quartz substrate at a speed of 1000 rpm, and were dried at room temperature, thereby obtaining dry gels. The FT-IR spectra of the substances obtained by subjecting the dry gels to UV ozone treatment for 30 minutes and the dry gels before UV ozone treatment were compared.

Figure 34:
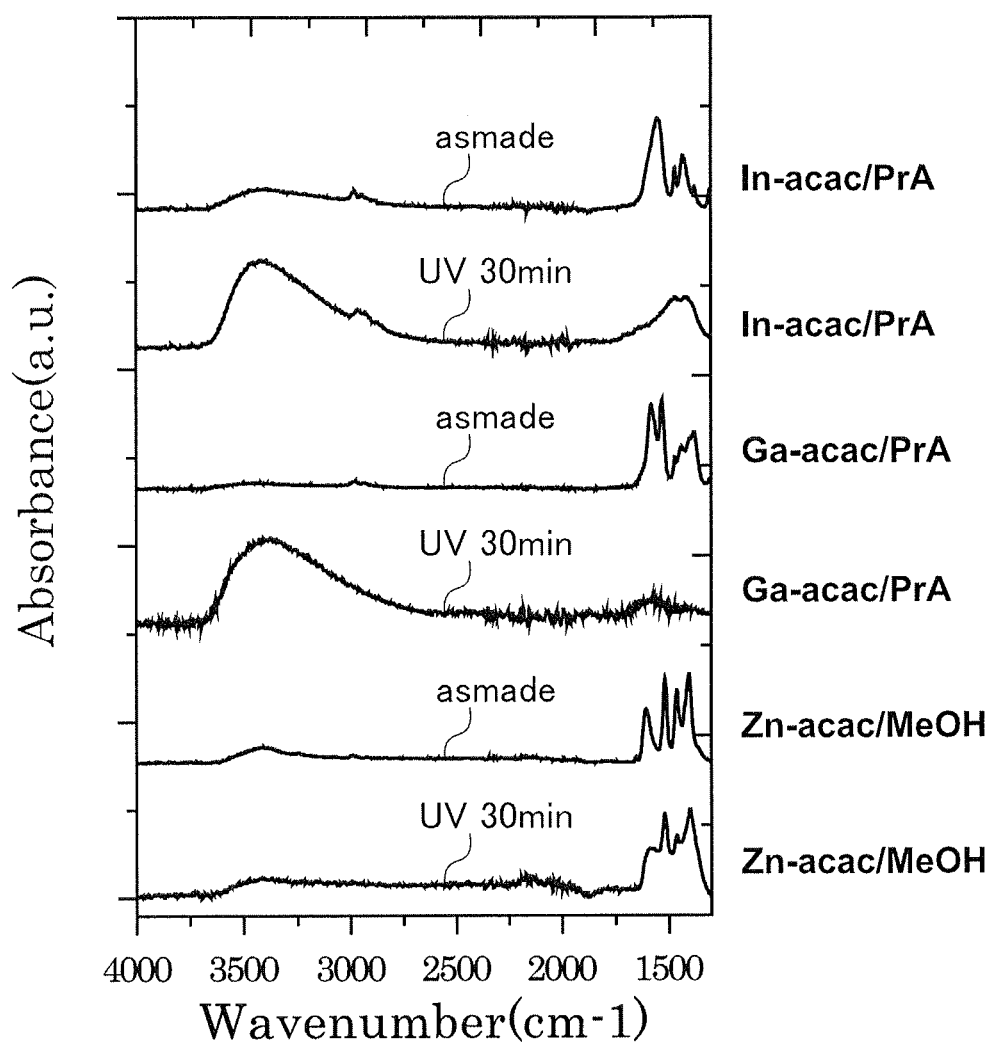
FIG. 34 is a diagram showing the FT-IR spectrum of the respective dry gels.

FIG. 34 is a diagram showing the FT-IR spectrum of the respective dry gels.

As shown in FIG. 34, the FT-IR spectrum of the In-containing dry gel that has been subjected to UV ozone treatment conforms with the double peak that appears in FIG. 11 and FIG. 12, and in FIG. 28 and FIG. 29. Accordingly, it is understood that the double peak, which is positioned within the range of from 1380 $cm^{-1}$ to 1520 $cm^{-1}$ and appears in FIG. 11 and FIG. 12, and in FIG. 28 and FIG. 29, is derived from the In precursor raw material.

All publications, patent applications, and technical standards mentioned in this specification are herein incorporated by reference to the same extent as if such individual publication, patent application, or technical standard was specifically and individually indicated to be incorporated by reference.

The invention claimed is:

1. A method for producing an amorphous oxide thin film, the method comprising:
   a pre-treatment process of selectively changing a binding state of an organic component, at a temperature lower than a pyrolysis temperature of the organic component, in a first oxide precursor film containing the organic component and In, to obtain a second oxide precursor film in which, when an infrared wave number range of from 1380 $cm^{-1}$ to 1520 $cm^{-1}$ in an infrared absorption spectrum obtained by performing a measurement by Fourier transform infrared spectroscopy is divided into an infrared wave number range of from 1380 $cm^{-1}$ to 1450 $cm^{-1}$ and an infrared wave number range of from more than 1450 $cm^{-1}$ to 1520 $cm^{-1}$, a peak positioned within the infrared wave number range of from 1380 $cm^{-1}$ to 1450 $cm^{-1}$ exhibits the maximum value in the infrared absorption spectrum within an infrared wave number range of from 1350 $cm^{-1}$ to 1750 $cm^1$; and
   a post-treatment process of removing the organic component remaining in the second oxide precursor film, to transform the second oxide precursor film into an amorphous oxide thin film containing In,
   wherein the pre-treatment process is a photo treatment process, wherein the first oxide precursor film comprises an inorganic component including In and at least one selected from the group consisting of Ga, Zn, and Sn, and wherein a composition of the inorganic component is In:Ga:Zn =2-x:x:1 (in which, x represents a number of from 0.8 to 1.05), and
   further comprising, before the pre-treatment process, a formation process of forming the first oxide precursor film by a liquid phase method using a solution containing a metal alkoxide or an organic acid salt.

2. The method for producing an amorphous oxide thin film according to claim 1, wherein the selectively changing a binding state of the organic component in the pre-treatment process comprises a change corresponding to a lowering of a peak which is derived from the organic component and is positioned within an infrared wave number range of from 1500 $cm^{-1}$ to 1600 $cm^{-1}$, in an infrared absorption spectrum obtained when the second oxide precursor film is analyzed by Fourier transform infrared spectroscopy.

3. The method for producing an amorphous oxide thin film according to claim 2, wherein, in the infrared absorption spectrum obtained when the second oxide precursor film is analyzed by Fourier transform infrared spectroscopy, a rate of the absorbance value of the peak positioned within the infrared wave number range of from 1500 $cm^{-1}$ to 1600 $cm^{-1}$, with respect to the absorbance value of the peak positioned within the infrared wave number range of from 1500 $cm^{-1}$ to 1600 $cm^{-1}$ before the pre-treatment process, is 0.37 or less.

4. The method for producing an amorphous oxide thin film according to claim 3, wherein, in the infrared absorption spectrum obtained when the second oxide precursor film is analyzed by Fourier transform infrared spectroscopy, a rate of the absorbance value of the peak positioned within the infrared wave number range of from 1500 $cm^{-1}$ to 1600 $cm^{-1}$, with respect to the absorbance value of the peak positioned within the infrared wave number range of from 1500 $cm^{-1}$ to 1600 $cm^{-1}$ before the pre-treatment process, is 0.11 or less.

5. The method for producing an amorphous oxide thin film according to claim 1, wherein the selectively changing a binding state of the organic component in the pre-treatment process comprises a change corresponding to a lowering of a peak which is derived from the organic component and is positioned within an infrared wave number range of from 2750 $cm^{-1}$ to 3050 $cm^{-1}$, in an infrared absorption spectrum obtained when the second oxide precursor film is analyzed by Fourier transform infrared spectroscopy.

6. The method for producing an amorphous oxide thin film according to claim 1, wherein the photo treatment process comprises irradiating the first oxide precursor film with ultraviolet rays.

7. The method for producing an amorphous oxide thin film according to claim 1, wherein, in the pre-treatment process, the photo treatment is performed using a total amount of energy of 6.0 $J/cm^2$ or more, when a peak positioned within the infrared wave number range of from 1380 $cm^{-1}$ to 1520 $cm^1$, in the infrared absorption spectrum obtained when the second oxide precursor film is analyzed by Fourier transform infrared spectroscopy, begins to exhibit the maximum value in the infrared absorption spectrum within the infrared wave number range of from 1350 $cm^{-1}$ to 1750 $cm^{-1}$, along with a lapse of time of the photo treatment.

8. The method for producing an amorphous oxide thin film according to claim 7, wherein, in the pre-treatment process, the photo treatment is performed using a total amount of energy of 9.0 $J/cm^2$ or less, when a peak positioned within the infrared wave number range of from 1380 $cm^{-1}$ to 1520 $cm^{-1}$, in the infrared absorption spectrum obtained when the second oxide precursor film is analyzed by Fourier transform infrared spectroscopy, begins to exhibit the maximum value in the infrared absorption spectrum within the infrared wave number range of from 1350 $cm^{-1}$ to 1750 $cm^{-1}$, along with a lapse of time of the photo treatment.

9. The method for producing an amorphous oxide thin film according to claim 1, wherein the post-treatment process is a heat treatment process of performing heat treatment at a temperature equal to or higher than 425° C.

10. The method for producing an amorphous oxide thin film according to claim 1, wherein a composition of the inorganic component is a composition such that $InGaZnO_{4-\delta}$ (in which, δ represents an oxygen nonstoichiometric amount) appears in a single phase as a crystalline phase, resulting from a heat treatment process at a temperature equal to or higher than a crystallization temperature.

11. A thin film transistor comprising, as an active layer, an amorphous oxide thin film produced by the method for producing an amorphous oxide thin film according to claim 1.

12. The thin film transistor according to claim 11, wherein a thickness of the active layer is from 1 nm to 100 nm.

13. A thin film transistor comprising, as an insulating layer, an amorphous oxide thin film produced by the method for producing an amorphous oxide thin film according to claim 1.

14. A thin film transistor comprising, as a conductive layer, an amorphous oxide thin film produced by the method for producing an amorphous oxide thin film according to claim 1.

* * * * *